US011315949B2

(12) United States Patent
Herrmann et al.

(10) Patent No.: US 11,315,949 B2
(45) Date of Patent: Apr. 26, 2022

(54) CHARGE-TRAPPING SIDEWALL SPACER-TYPE NON-VOLATILE MEMORY DEVICE AND METHOD

(71) Applicant: GLOBALFOUNDRIES Dresden Module One Limited Liability Company & Co. KG, Dresden (DE)

(72) Inventors: Tom Herrmann, Dresden (DE); Steven R. Soss, Saratoga Springs, NY (US); Leitao Liu, Clifton Park, NY (US); Alban Zaka, Dresden (DE)

(73) Assignee: GlobalFoundries Dresden Module One Limited Liability Company & Co. KG, Dresden (DE)

( * ) Notice: Subject to any disclaimer, the term of this patent is extended or adjusted under 35 U.S.C. 154(b) by 0 days.

(21) Appl. No.: 17/020,905

(22) Filed: Sep. 15, 2020

(65) Prior Publication Data
US 2022/0085054 A1  Mar. 17, 2022

(51) Int. Cl.
*H01L 29/66* (2006.01)
*H01L 27/11582* (2017.01)

(52) U.S. Cl.
CPC .... *H01L 27/11582* (2013.01); *H01L 29/6656* (2013.01); *H01L 29/66833* (2013.01)

(58) Field of Classification Search
CPC .............. H01L 29/6683; H01L 29/6656; H01L 27/1052; H01L 29/792
See application file for complete search history.

(56) References Cited

U.S. PATENT DOCUMENTS

| 7,227,234 | B2 | 6/2007 | Roizin et al. |
| 9,806,170 | B1 | 10/2017 | Mulfinger et al. |
| 9,893,208 | B2 | 2/2018 | Horiuchi |
| 9,966,141 | B2 | 5/2018 | Horiuchi |
| 2017/0352676 | A1* | 12/2017 | Ogata .................. H01L 21/265 |
| 2019/0252394 | A1 | 8/2019 | Wu et al. |
| 2019/0280108 | A1 | 9/2019 | Toh et al. |

* cited by examiner

*Primary Examiner* — Fernando L Toledo
*Assistant Examiner* — Valerie N Newton
(74) *Attorney, Agent, or Firm* — Gibb & Riley, LLC

(57) ABSTRACT

Disclosed are a semiconductor structure, which includes a charge-trapping sidewall spacer-type non-volatile memory (CTSS-NVM) device, and a method of forming the structure. The CTSS-NVM device includes asymmetric first and second sidewall spacers on opposing sidewalls of a gate structure above a channel region in a semiconductor substrate. The second sidewall spacer is wider than the first and includes multiple dielectric spacer layers, one of which is made of a charge-trapping material, is separated from the substrate (e.g., by a thin oxide layer), and has a bottom end closest to the substrate with a maximum width that is sufficient to achieve charge-trapping for proper CTSS-NVM device operation. The CTSS-NVM device further includes an epitaxial semiconductor layer for a source/drain region on the semiconductor substrate adjacent to the first sidewall spacer and a metal silicide layer for a Schottky barrier on the semiconductor substrate adjacent to the second sidewall spacer.

20 Claims, 27 Drawing Sheets

CHARGE-TRAPPING SIDEWALL SPACER-TYPE NON-VOLATILE MEMORY DEVICE AND METHOD

BACKGROUND

Field of the Invention

The present invention relates to non-volatile memory devices (NVMs) and, particularly, to a charge-trapping sidewall spacer-type non-volatile memory (CTSS-NVM) device and a method of forming the CTSS-NVM device.

Description of Related Art

Non-volatile memory (NVM) devices that employ charge-trapping layers to store data have recently been developed. Once such NVM device is a charge-trapping sidewall spacer-type NVM (CTSS-NVM) device, which is configured similarly to a field effect transistor (FET) and employs a charge-trapping gate sidewall spacer for storing a data bit. Specifically, an exemplary CTSS-NVM device includes: a semiconductor layer; a channel region within the semiconductor layer and positioned laterally between a first source/drain region and a second source/drain region; a gate structure on the semiconductor layer above the channel region; and first and second gate spacers on opposing sidewalls of the gate structure (e.g., adjacent to the first and second source/drain regions, respectively). At least one of the gate sidewall spacers can be configured as a data storage node and can include: a relatively thin silicon dioxide ($SiO_2$) layer, which has a first segment on a gate sidewall and a second segment on the top surface of the semiconductor layer; and a relatively thick charge-trapping dielectric layer seated on the $SiO_2$ layer (i.e., above the second segment and positioned laterally adjacent to the first segment). Depending upon the biasing conditions applied to the gate structure, the first source/drain region and the second source/drain region, a charge can be forced into the charge-trapping dielectric layer of the data storage node (i.e., the CTSS-NVM device is programmed or, more particularly, stores a "1" data bit), a charge can be removed from the charge-trapping dielectric layer of the data storage node (i.e., the CTSS-NVM device is erased or, more particularly, stores a "0" data bit), or the state of the CTSS-NVM device, as programmed or erased, can be read. Unfortunately, with technology scaling, data storage and retention using such CTSS-NVM devices has become problematic.

SUMMARY

Disclosed herein are embodiments of a semiconductor structure, which includes a charge-trapping sidewall spacer-type non-volatile memory (CTSS-NVM) device. Specifically, each of the semiconductor structure embodiments can include a semiconductor substrate and a CTSS-NVM device. The CTSS-NVM device can include a channel region in the semiconductor substrate and a gate structure on the semiconductor substrate adjacent to the channel region. The CTSS-NVM device can further include asymmetric sidewall spacers (referred to herein as a first sidewall spacer and a second sidewall spacer) on opposing sidewalls (referred to herein as a first sidewall and a second sidewall) of the gate structure. The first sidewall spacer can have a first width. The second sidewall spacer can have a second width that is greater than the first width and can include a charge-trapping dielectric material. As discussed further in the detailed description section, depending upon the embodiment of the method used to form the semiconductor structure and, particularly, used to form the CTSS-NVM device, the second sidewall spacer can include multiple dielectric spacer layers, one of the dielectric spacer layers can be made of the charge-trapping material and the spacer layer that is made of the charge-trapping material can be physically separated from the semiconductor substrate (e.g., by a thin oxide layer) and can either be tapered (i.e., can be essentially D-shaped or backwards D-shaped, depending upon the side of the gate structure) or have first and second segments that are essentially perpendicular (i.e., can be essentially L-shaped or backwards L-shaped, depending upon the side of the gate structure). In any case, the dielectric spacer layer made of the charge-trapping dielectric material can have a bottom end (i.e., the end closest to the semiconductor substrate) with a maximum width that is sufficient to achieve the charge-trapping required for proper CTSS-NVM device operation. The CTSS-NVM device can further include a semiconductor layer for a source/drain region (e.g., an in-situ doped epitaxial semiconductor layer) on the semiconductor substrate adjacent to the first sidewall spacer and an additional layer comprising metal (e.g., a metal silicide layer) for a Schottky barrier diode on the semiconductor substrate adjacent to the second sidewall spacer.

Also disclosed herein are embodiments of a method of forming the above-described semiconductor structure, which includes a charge-trapping sidewall spacer-type non-volatile memory (CTSS-NVM) device. The method embodiments can include providing a semiconductor substrate and forming a CTSS-NVM device on the semiconductor substrate. Forming the CTSS-NVM device can include forming a gate structure on the semiconductor substrate adjacent to a channel region within the semiconductor substrate. Forming the CTSS-NVM device can further including forming asymmetric sidewall spacers on opposing sidewalls of the gate structure. Specifically, a first sidewall spacer with a first width can be formed on a first sidewall of the gate structure. Additionally, a second sidewall spacer with a second width that is greater than the first width can be formed on a second sidewall of the gate structure opposite the first sidewall. The second sidewall spacer can further be formed so as to include a charge-trapping material. For example, the second sidewall spacer can be formed so as to include multiple dielectric spacer layers. One of the dielectric spacer layers can be made of the charge-trapping dielectric material, physically separated from the semiconductor substrate (e.g., by a thin oxide layer) and, depending upon the particular method embodiment, can be tapered (i.e., can be essentially D-shaped or backwards D-shaped, depending upon the side of the gate structure) or, alternatively, can have first and second segments that are parallel to the gate structure and semiconductor substrate, respectively (i.e., can be essentially L-shaped or backwards L-shaped, depending upon the side of the gate structure). In any case, the second sidewall spacer can be formed so that the dielectric spacer layer made of the charge-trapping dielectric material has a bottom end (i.e., the end closest to the semiconductor substrate) with a maximum width that is sufficient to achieve the charge-trapping required for proper CTSS-NVM device operation. Forming the CTSS-NVM device can further include, after completing formation of the first sidewall spacer and before completing formation of the second sidewall spacer, forming a semiconductor layer for a source/drain region (e.g., an in-situ doped epitaxial semiconductor layer) on the semiconductor substrate adjacent to the first sidewall spacer. Forming the CTSS-NVM device can further include, after completing formation of the second sidewall spacer, forming an additional layer comprising a metal (e.g., a metal silicide layer) for a Schottky barrier diode on the semiconductor substrate adjacent to the second sidewall spacer.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1A:
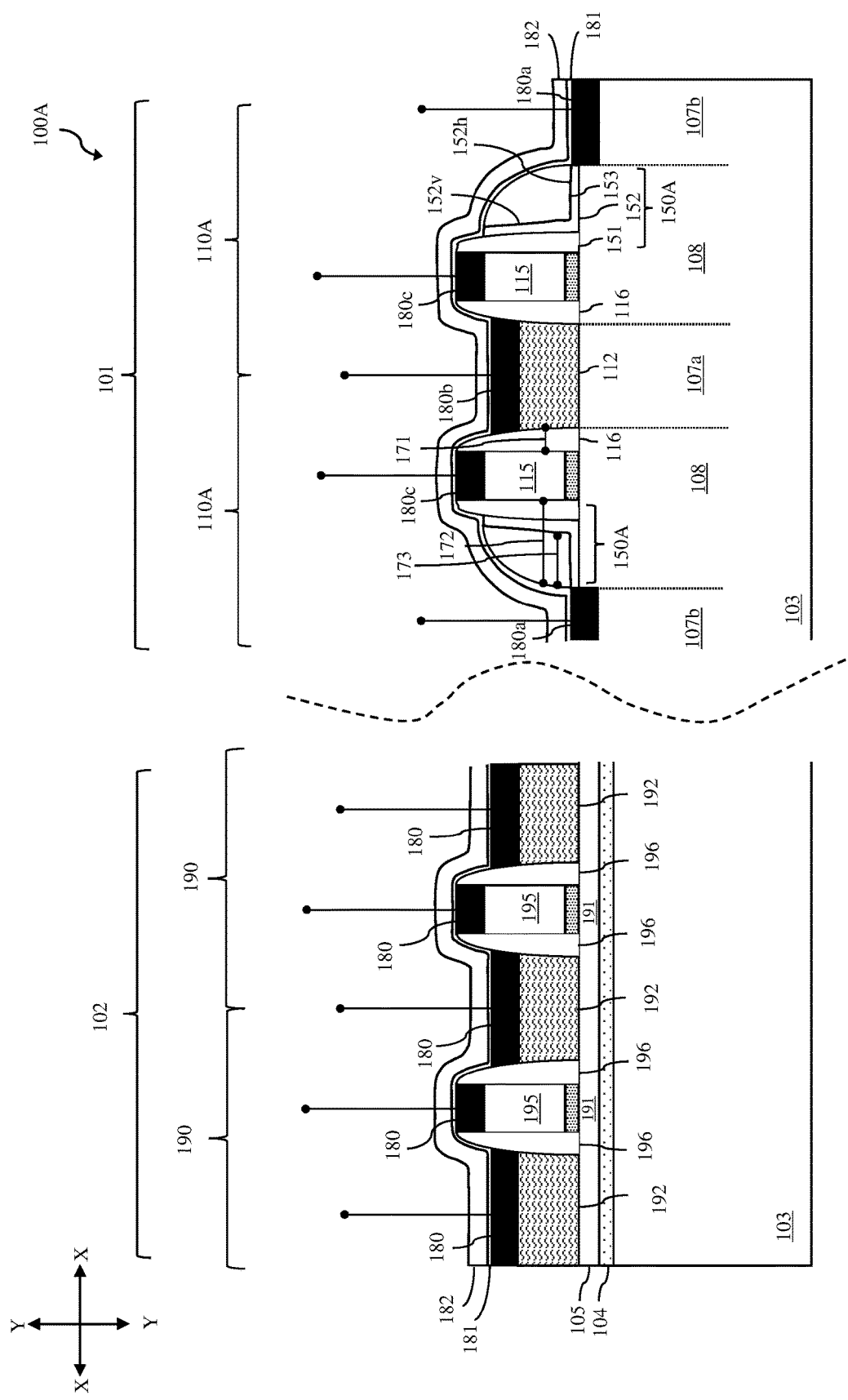
FIGS. 1A, 1B, and 1C are cross-section diagrams illustrating different semiconductor embodiments disclosed herein.

Non-volatile memory (NVM) devices that employ charge-trapping layers to store data have recently been developed. Once such NVM device is a charge-trapping sidewall spacer-type NVM (CTSS-NVM) device, which is configured similarly to a field effect transistor (FET) and employs a charge-trapping gate sidewall spacer for storing a data bit. Specifically, an exemplary CTSS-NVM device includes: a semiconductor layer; a channel region within the semiconductor layer and positioned laterally between a first source/drain region and a second source/drain region; a gate structure on the semiconductor layer above the channel region; and first and second gate spacers on opposing sidewalls of the gate structure (e.g., adjacent to the first and second source/drain regions, respectively). At least one gate sidewall spacer can be configured as a data storage node and can include: a relatively thin silicon dioxide ($SiO_2$) layer, which has a first segment on a gate sidewall and a second segment on the top surface of the semiconductor layer; and a relatively thick charge-trapping dielectric layer (e.g., a silicon nitride (SiN) layer) seated on the $SiO_2$ layer above the second segment and positioned laterally adjacent to the first segment. Depending upon the biasing conditions applied to the gate structure, the first source/drain region and the second source/drain region, a charge can be forced into the charge-trapping dielectric layer of the data storage node (i.e., the CTSS-NVM device is programmed or, more particularly, stores a "1" data bit), a charge can be removed from the charge-trapping dielectric layer of the data storage node (i.e., the CTSS-NVM device is erased or, more particularly, stores a "0" data bit), or the state of the CTSS-NVM device, as programmed or erased, can be read.

Recently, with technology scaling to achieve higher device density, the overall widths of gate sidewall spacers has been significantly reduced. Unfortunately, it has been determined that if the charge-trapping dielectric layer within a gate sidewall spacer designed to function as a data storage node within a CTSS-NVM device is reduced to 15 nm or less, then the charge-trapping necessary for programming may not be achievable. For example, consider the exemplary case where 22 nm fully-depleted silicon-on-insulator (SOI) technology field effect transistors (FETs) and CTSS-NVM devices are formed on the SOI areas and bulk silicon areas, respectively, of the same hybrid silicon wafer (i.e., a silicon wafer that includes both SOI areas and bulk silicon areas). Ideally, integrated processing is used to concurrently form same-type components (e.g., gate structures, gate sidewall spacers, etc.) of the FETs and CTSS-NVM devices. However, known techniques for integrated gate sidewall spacer processing result in each CTSS-NVM device having a data storage node where the maximum width of the charge-trapping dielectric layer is significantly less than 15 nm (e.g., 10 nm or less). As a result, the charge-trapping required for programming the CTSS-NVM device is not achievable.

In view of the foregoing, disclosed herein are embodiments of a semiconductor structure, which includes a charge-trapping sidewall spacer-type non-volatile memory (CTSS-NVM) device. The CTSS-NVM device can include asymmetric first and second sidewall spacers on opposing sidewalls of a gate structure on a semiconductor substrate. The second sidewall spacer can be wider than the first sidewall spacer and can include multiple dielectric spacer layers, one of which is separated from the semiconductor substrate (e.g., by a thin oxide layer), is made of a charge-trapping material, and has an end closest to the semiconductor substrate with a maximum width that is sufficient to achieve the charge-trapping required for proper CTSS-NVM device operation. The CTSS-NVM device can further include a semiconductor layer for a source/drain region (e.g., a doped epitaxial semiconductor layer) on the semiconductor substrate adjacent to the first sidewall spacer and an additional layer comprising a metal (e.g., a metal silicide layer) for a Schottky barrier on the semiconductor substrate adjacent to the second sidewall spacer. Optionally, the semiconductor structure can be a hybrid structure with CTSS-NVM device(s) being located on a bulk semiconductor area of a hybrid semiconductor wafer and with one or more other-types of semiconductor devices (e.g., fully-depleted semiconductor-on-insulator field effect transistor(s)) being located on a semiconductor-on-insulator area of the same hybrid semiconductor wafer. Also disclosed herein are embodiments of a method of forming the semiconductor structure.

Figure 1B:
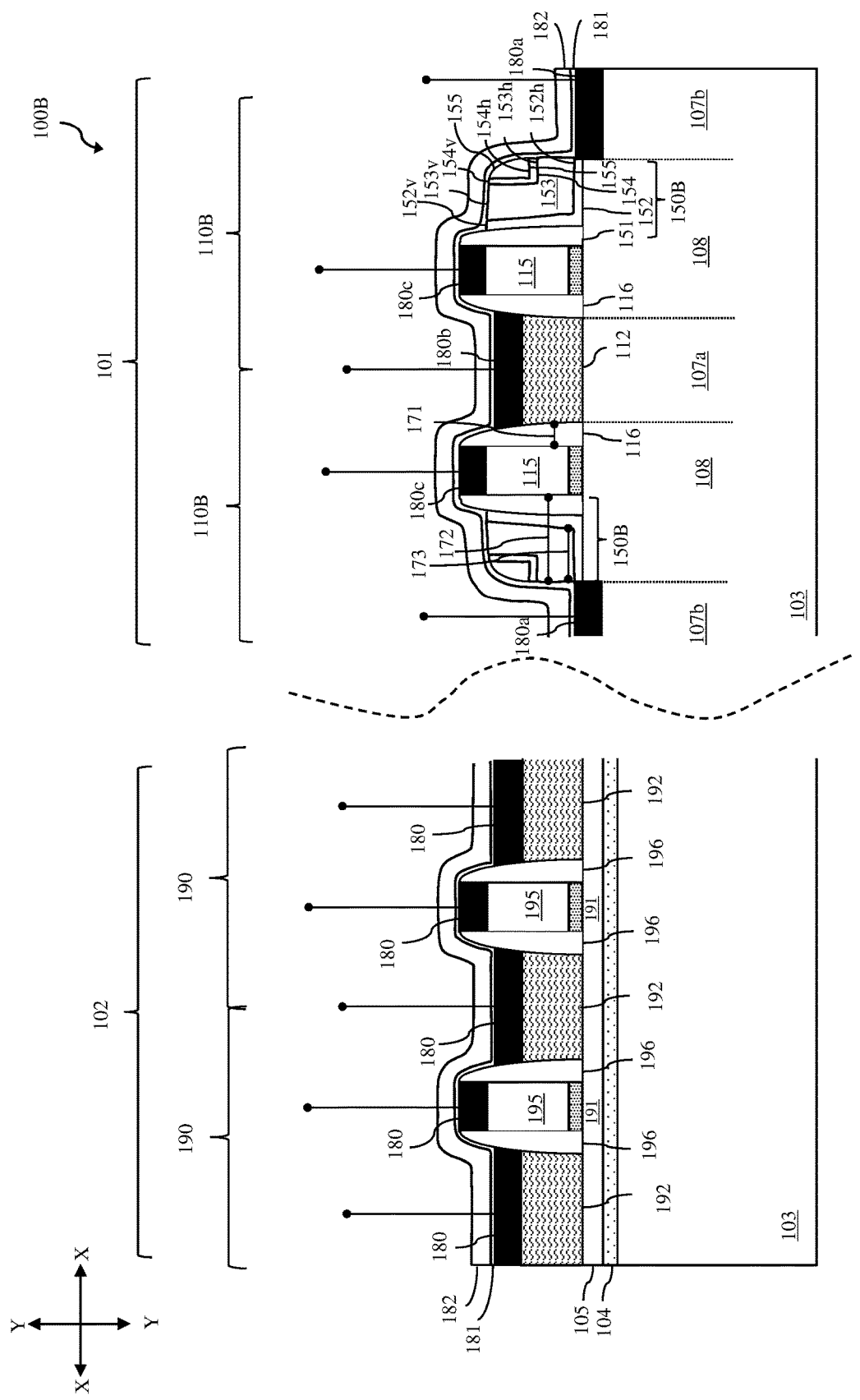
Figure 1C:
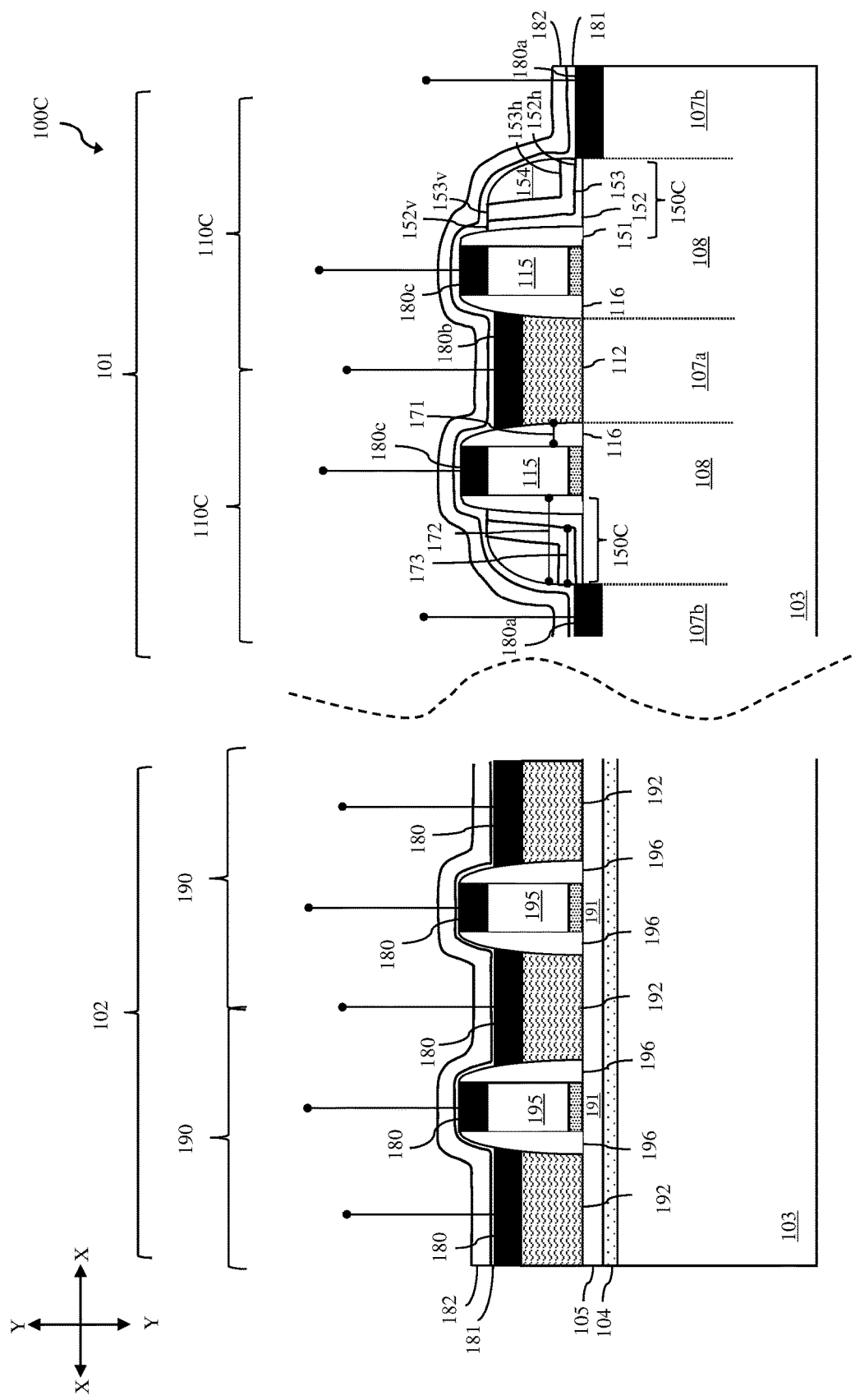

More particularly, referring to FIGS. 1A, 1B, and 1C, disclosed herein are embodiments of a semiconductor structure 100A, 100B, and 100C and embodiments of a charge-trapping sidewall spacer-type non-volatile memory (CTSS-NVM) device 110A, 110B, 110C that can be incorporated into the semiconductor structure 100A, 100B, 100C.

The semiconductor structure 100A, 100B, 100C can be a bulk structure with the CTSS-NVM device(s) 110A, 110B, 110C and, optionally, any other bulk semiconductor devices being located on a bulk semiconductor substrate (e.g., a bulk silicon substrate).

Alternatively, the semiconductor structure 100A, 100B, 100C can be a hybrid structure, as illustrated. The hybrid structure can include a semiconductor substrate 103 (e.g., a silicon substrate) with one or more bulk semiconductor area(s) 101 (e.g., bulk silicon area(s)) and with one or more semiconductor-on-insulator areas 102 (e.g., silicon-on-insulator (SOI) area(s)) adjacent to the bulk semiconductor area(s) 101. Each bulk semiconductor area 101 can include bulk semiconductor device(s) including, but not limited to, CTSS-NVM device(s) 110A, 110B, 110C, which are formed using an upper portion of the semiconductor substrate 103. Each semiconductor-on-insulator area 102 can include: an insulator layer 104 (e.g., a buried oxide layer or other suitable insulator layer) immediately adjacent to the top surface of the semiconductor substrate 103; a semiconductor-on-insulator layer 105 (e.g., a silicon-on-insulator (SOI) layer or other suitable semiconductor-on-insulator layer), which is relatively thin (e.g., 20 nm or less, preferably 4-12 nm) and which is immediately adjacent to the top surface of the insulator layer 104); and one or more semiconductor-on-insulator devices (e.g., fully-depleted semiconductor-on-insulator field effect transistor(s) 190 or any other suitable semiconductor-on-insulator devices), which are formed using the semiconductor-on-insulator layer 105.

In any case, the CTSS-NVM device 110A, 110B, 110C can include a channel region 108 in the semiconductor substrate 103 adjacent to the top surface. The channel region 108 can be either undoped or doped so as to have a first-type conductivity at a relatively low conductivity level (see detailed discussion below).

The CTSS-NVM device 110A, 110B, 110C can further include a gate structure 115 on the top surface of the semiconductor substrate 103 adjacent to the channel region 108. The gate structure 115 can include one or more gate dielectric layers and one or more gate conductor layers on the gate dielectric layer(s). In one exemplary embodiment, the gate dielectric layer(s) including a thin silicon dioxide ($SiO_2$) layer above and immediately adjacent to the top surface of the semiconductor substrate 103 and a thin high-K dielectric layer on the $SiO_2$ layer. The high-K dielectric layer can be a hafnium (Hf)-based dielectric (e.g., hafnium oxide, hafnium silicon oxide, hafnium silicon oxynitride, hafnium aluminum oxide, etc.) or some other suitable high-K dielectric (e.g., aluminum oxide, tantalum oxide, zirconium oxide, etc.). In the exemplary embodiment, the gate conductor layer(s) can include a thin titanium nitride (TiN) layer on the high-K gate dielectric layer, and an amorphous silicon (A-Si) layer on the TiN layer. It should be understood that the gate dielectric and conductor material layers mentioned-above are provided for illustration purposes and are not intended to be limiting. Alternatively, any other suitable gate dielectric and conductor material layers could be incorporated into the gate structure of the disclosed CTSS-NVM device. In any case, the gate structure 115 can further have opposing sidewalls (i.e., a first sidewall and a second sidewall opposite the first sidewall). The opposing sidewalls of the gate structure 115 can extend away from the top surface of the semiconductor substrate in the Y-direction such that they are essentially parallel to each other and essentially perpendicular to the top surface of the semiconductor substrate (which is oriented in the X-direction). The terms "essentially parallel" and "essentially perpendicular" are used to account for processing variations that: (a) may result in the opposing sidewalls being somewhat angled relative to the top surface of the semiconductor substrate (e.g., at 90 degrees plus or minus 0-20 degrees) as opposed to exactly perpendicular; (b) may result in the opposing sidewalls being somewhat curved as opposed to being exactly planar; and/or (c) may result in the top surface of the semiconductor substrate not being exactly planar.

The CTSS-NVM device 110A, 110B, 110C can further include asymmetric sidewall spacers on the opposing sidewalls of the gate structure 115. The asymmetric sidewall spacers can include a first sidewall spacer 116, which is positioned laterally immediately adjacent to the first sidewall of the gate structure 115 and which is configured as a conventional gate sidewall spacer, and a second sidewall spacer 150A, 150B, 150C, which is positioned laterally immediately adjacent to the second sidewall of the gate structure 115 opposite the first sidewall and which is specifically configured as a data storage node. For purposes of this disclosure, asymmetric sidewall spacers refer to sidewall spacers that are not symmetric. As discussed in greater detail below, the differences between the asymmetric sidewall spacers in the disclosed embodiments can be in size, in the number of spacer layers, and in the dielectric spacer materials employed for some of the spacer layer layer(s).

Specifically, the first sidewall spacer 116 and the second sidewall spacer 150A, 150B, 150C (i.e., the data storage node) can have different maximum widths.

The first sidewall spacer 116 can have a first maximum width 171, as measured from the first sidewall in the X-direction, which, as illustrated in the drawings, is essentially parallel to the top surface of the semiconductor substrate 103. The first maximum width 171 can be, for example, 3-15 nm. The second sidewall spacer 150A, 150B, 150C can have a second maximum width 172, as measured from the second sidewall in X-direction. This second maximum width 172 can be greater than the first maximum width 171 and can be, for example, three or more times greater than the first maximum width 171. For example, the second maximum width 172 can be 20-35 nm.

The first sidewall spacer 116 and the second sidewall spacer 150A, 150B, 150C of the CTSS-NVM device 110A, 110B, 110C can further have different numbers of spacer layers.

For example, the first sidewall spacer 116 can include a single spacer layer, as illustrated, which is positioned laterally immediately adjacent to the first sidewall of the gate structure 115. The single spacer layer can be oriented in the Y-direction, extending upward away from the semiconductor substrate such that it covers the first sidewall. The single spacer layer can be made of a first dielectric material. The first dielectric material can be, for example, a low-K dielectric material. For purposes of this disclosure, a "low-K dielectric material" refers to a dielectric material with a dielectric constant that is less than that of silicon nitride (i.e., less than 7). Exemplary low-K dielectric materials that could be employed include, but are not limited to, silicon-boron-carbon-nitride (SiBCN), silicon-oxygen-carbon-nitride (SiONC), silicon-carbon-nitride (SiCN), silicon oxycarbide (SiCO), and hydrogenated silicon oxycarbide (SiCOH). Alternatively, the first sidewall spacer 116 could include multiple spacer layers including one or more of the above-mentioned low-K dielectric materials. In any case, the spacer layer(s) for the first sidewall spacer 116 can, in total, be relatively thin such that the first maximum width 171 of the first sidewall spacer 116 is also relatively thin (e.g., 3-15 nm).

The second sidewall spacer 150A, 150B, 150C can include at least: a first spacer layer 151, a second spacer layer 152 and a third spacer layer 153.

The first spacer layer 151 of the second sidewall spacer 150A, 150B, 150C can be similar to the first sidewall spacer 116 in terms of dielectric spacer material(s) used. As discussed in greater detail below with regard to the method embodiments, the first spacer layer 151 of the second sidewall spacer 150A, 150B, 150C can be formed from the same spacer layer(s) used to form the first sidewall spacer 116, can be positioned laterally immediately adjacent to the second sidewall and can be oriented in the Y-direction, extending away from the semiconductor substrate 103 such that it covers the second sidewall of the gate structure 115. It should, however, be noted that the first sidewall spacer and the first spacer layer of the second sidewall spacer may not be symmetric because, depending upon the process steps used to form the asymmetric sidewall spacers, the shape of the first sidewall spacer 116 may be different from the first spacer layer of the second sidewall spacer. For example, the height of the first sidewall spacer, as measured from the top surface of the semiconductor substrate, may be different from the height of the first spacer layer 151 of the second sidewall spacer 150A, 150B, 150C, also as measured from the top surface of the semiconductor substrate 103.

The second spacer layer 152 of the second sidewall spacer 150A, 150B, 150C can be made of a second dielectric material. The second dielectric material can be, for example, silicon dioxide (SiO$_2$) or some other suitable dielectric material that is different from the first dielectric material. Additionally, the second spacer layer 152 can be essentially L-shaped or essentially backwards L-shaped, depending upon whether the second sidewall spacer is on the right-side or left-side of the gate structure 115, respectively. That is, the second spacer layer 152 can include: a first segment 152v, which is oriented in the Y-direction and positioned laterally immediately adjacent to a side surface of the first spacer layer 151; and a second segment 152h, which is above and immediately adjacent to the semiconductor substrate 103 and extends laterally in the X-direction along the top surface of the semiconductor substrate 103 such that it is essentially perpendicular to the first segment 152v. The second spacer layer 152 can be relatively thin (e.g., 2-6 nm) and the thickness of the second spacer layer 152 can be essentially uniform. That is, the first segment 152v and the second segment 152h can have the same thicknesses with the thickness of the first segment 152v being measured in the X-direction and the thickness of the second segment 152h being measured in the Y-direction.

The third spacer layer 153 of the second sidewall spacer 150A, 150B, 150C can be physically separated from the semiconductor substrate by the second spacer layer 152 and can be made of a third dielectric material. The third dielectric material can be different from the first dielectric material and the second dielectric material and, more specifically, can be a charge-trapping dielectric material (e.g., silicon nitride (SiN) or some other suitable charge-trapping dielectric material). The third spacer layer 153 can be seated on the second spacer layer 152 and, more specifically, can be positioned above and immediately adjacent to the second segment 152h of the second spacer layer 152 and further positioned laterally immediately adjacent to the first segment 152v of the second spacer layer 152. The third spacer layer 153 can have a third maximum width 173 at the bottom end closet to the second segment 152h and measured in the X-direction. This third maximum width 173 can specifically be no less than the minimum width determined to be sufficient to achieve the charge-trapping required for proper CTSS-NVM device operation. For example, the third maximum width 173 of the third spacer layer 153 can be no less than 15 nm.

The shape of the third spacer layer 153 of the second sidewall spacer 150A, 150B, 150C can vary depending upon the embodiment of the CTSS-NVM device.

More specifically, as shown in the CTSS-NVM device 110A of FIG. 1A, the third spacer layer 153 can be relatively thick and tapered (e.g., essentially D-shaped or essentially backwards D-shaped, depending upon whether the second sidewall spacer is on the right-side or left-side of the gate structure 115). That is, the third spacer layer 153 can have a bottom end immediately adjacent to the second segment 152h of the second spacer layer 152, a top end opposite the bottom end, a first side surface positioned laterally immediately adjacent to the first segment 152v of the second spacer layer 152, and a second side surface opposite the first side surface and curved such that the third spacer layer 153 is tapered from the maximum width (e.g., of at least 15 nm, e.g., 15-30 nm) at the bottom end to a minimum width at the top end.

Alternatively, as shown in the CTSS-NVM device 110B shown in FIG. 1B or in the CTSS-NVM device 110C shown in FIG. 1C, the third spacer layer 153 can be essentially L-shaped or essentially backwards L-shaped, depending upon whether the second sidewall spacer is on the right-side or left-side of the gate structure 115. That is, the third spacer layer 153 can include first and second segments 153v and 153h. The first segment 153v of the third spacer layer 153 can be oriented in the Y-direction and can be positioned laterally immediately adjacent to the first segment 152v of the second spacer layer 152. The second segment 153h of the third spacer layer 153 can be positioned above and immediately adjacent to the second segment 152h of the second spacer layer 152 and can be oriented in the X-direction such that it is essentially perpendicular to the first segment 153v. The third spacer layer 153 can be relatively thin (e.g., 5-15 nm), but thicker than the second spacer layer 152 and the thickness of the third spacer layer 153 can be essentially uniform. That is, the first segment 153v and the second segment 153h can have the same thicknesses with the thickness of the first segment 153v being measured in the X-direction and the thickness of the second segment 153h being measured in the Y-direction.

The total number of spacer layers in the second sidewall spacer 150A, 150B, 150C can vary depending upon the embodiment of the CTSS-NVM device.

For example, as shown in the CTSS-NVM device 110A of FIG. 1A, the second sidewall spacer 150A can include only the three spacer layers 151-153 discussed above with the third spacer layer 153 being relatively thick and tapered (i.e., essentially D-shaped or backwards D-shaped).

Alternatively, as shown in the CTSS-NVM device 110B of FIG. 1B, the second sidewall spacer 150B can include two additional spacer layers: a fourth spacer layer 154 and a fifth spacer layer 155. Specifically, the second sidewall spacer 150B can include a fourth spacer layer 154, which is made, for example, of the same second dielectric material used for the second spacer layer 152 (e.g., silicon dioxide (SiO$_2$)) or alternatively some other suitable dielectric material. The fourth spacer layer 154 of the second sidewall spacer 150B can be essentially L-shaped or essentially backwards L-shaped, depending upon whether the second sidewall spacer is on the right-side or left-side of the gate structure 115, and seated in the essentially L-shaped or essentially backwards L-shaped third spacer layer 153. That is, the fourth spacer layer 154 in the second sidewall spacer 150B can include first and second segments 154v and 154h. The first segment 154v of the fourth spacer layer 154 can be oriented in the Y-direction and positioned laterally immediately adjacent to the first segment 153v of the third spacer layer 153. The second segment 154h of the fourth spacer layer 154 can be positioned above and immediately adjacent to the second segment 153h of the third spacer layer 153 and can be oriented in the X-direction such that it is essentially perpendicular to the first segment 154v. The fourth spacer layer 154 can be relatively thin (e.g., 2-6 nm) and the thickness of the fourth spacer layer 154 can be essentially uniform. That is, the first segment 154v and the second segment 154h can have the same thicknesses with the thickness of the first segment 154v being measured in the X-direction and the thickness of the second segment 154h being measured in the Y-direction. The second sidewall spacer 150B can also include a fifth spacer layer 155, which is seated on the fourth spacer layer 154 and tapered (i.e., essentially D-shaped or essentially backwards D-shaped, depending upon whether the second sidewall spacer is on the right-side or left-side of the gate structure 115). That is, the fifth spacer layer 155 can have a bottom end immediately adjacent to the second segment 154h of the fourth spacer layer 154, a top end opposite the bottom end, a first side surface positioned laterally immediately adjacent to the first segment 154v of the fourth spacer layer, and a second side surface opposite the vertical side surface and curved such that the fifth spacer layer 155 is tapered from the bottom end to the top end. The fifth spacer layer 155 can be made, for example, of the same third dielectric material used for the third spacer layer 153 (e.g., silicon nitride (SiN)) or alternatively some other suitable dielectric material). The fifth spacer layer 155 can have a maximum width of, for example, 5-25 nm as measured in the X-direction at the bottom end adjacent to the second segment 154h of the fourth spacer layer.

Alternatively, as shown in the CTSS-NVM device 110C of FIG. 1C, the second sidewall spacer 150C can include one additional spacer layer and, particularly, a fourth spacer layer 154. The fourth spacer layer 154 in the second sidewall spacer 150C can be made, for example, of the same second dielectric material used for the second spacer layer 152 (e.g., silicon dioxide ($SiO_2$)). In this case, it can be relatively thick and tapered (i.e., essentially D-shaped or essentially backwards D-shaped, depending upon whether the second sidewall spacer is on the right-side or left-side of the gate structure 115). That is, the fourth spacer layer 154 can have a bottom end immediately adjacent to the second segment 153h of the third spacer layer 153, a top end opposite the bottom end, a first side surface positioned laterally immediately adjacent to the first segment 153v of the third spacer layer 153, and a second side surface opposite the first side surface and curved such that the fourth spacer layer 154 is tapered from the bottom end to the top end. This fourth spacer layer 154 can have a maximum width of, for example, 10-30 nm as measured in the X-direction at the bottom end adjacent to the second segment 153h of the third spacer layer.

It should be noted that each of the essentially L-shaped (or essentially backwards L-shaped) spacer layers of the second sidewall spacer 150A, 150B, 150C is described above as having a first segment oriented in the Y-direction (e.g., essentially parallel to the sidewall of the gate structure) and a second segment oriented in the X-direction (e.g., essentially parallel to the top surface of the semiconductor substrate) so as to be essentially perpendicular to the first segment. It should be understood that the term "essentially perpendicular" is used to account for processing variations that: may result in the first segment and the second segment being somewhat angled relative to each other (e.g., at 90 degrees plus or minus 0-20 degrees) as opposed to exactly perpendicular; and/or (b) may result in the first segment and/or the second segment being curved as opposed to being exactly planar.

The CTSS-NVM device 110A, 110B, 110C can further include a semiconductor layer 112 for a raised source/drain region, which is on and, particularly, above and immediately adjacent to the top surface of source/drain region 107a of the semiconductor substrate 103 and which is further positioned laterally immediately adjacent to the first sidewall spacer 116 such that it is physically separated from the gate structure 115 by a first distance equal to the first maximum width 171. The semiconductor layer 112 can be an epitaxial semiconductor layer, an epitaxial silicon layer, an epitaxial silicon germanium layer or some other suitable epitaxial semiconductor layer).

It should be noted that, for a P-type CTSS-NVM device, the semiconductor layer 112 can be an epitaxial silicon layer, an epitaxial silicon germanium layer or any other suitable type of epitaxial semiconductor layer doped with a P-type dopant so as to have a P-type conductivity at a relatively high conductivity level and the semiconductor substrate 103 particularly in the channel region 108 can be either undoped or doped with an N-type dopant so as to have an N-type conductivity at a relatively low conductivity level. Contrarily, for an N-type CTSS-NVM device, the semiconductor layer 112 can be an epitaxial silicon layer or some other suitable epitaxial semiconductor layer doped with an N-type dopant so as to have an N-type conductivity at a relatively high conductivity level and the semiconductor substrate 103 particularly in the channel region 108 can be either undoped or doped with a P-type dopant so as to have a P-type conductivity at a relatively low conductivity level.

The CTSS-NVM device 110A, 110B, 110C can further include an additional layer 180a comprising a metal for a Schottky barrier diode on and, particularly, above and immediately adjacent to the top surface of a Schottky barrier diode region. This additional layer can be, for example, one of multiple metal silicide layers. Specifically, the CTSS-NVM device 110A, 110B, 110C can further include multiple metal silicide layers. One metal silicide layer 180a for a Schottky barrier diode can be on and, particularly, above and immediately adjacent to the top surface of a Schottky barrier diode region 107b of the semiconductor substrate 103 adjacent to the second sidewall spacer 150A, 150B, 150C such that it is physically separated from the gate structure 115 by a second distance equal to the second maximum width 172. Another metal silicide layer 180b can be above and immediately adjacent to the top surface of the semiconductor layer 112 so as to be positioned laterally immediately adjacent to the first sidewall spacer 116. Yet another metal silicide layer 180c can above and immediately adjacent to the top surface of the gate structure 115 (e.g., on the A-Si layer) so as to be positioned laterally between the first sidewall spacer 116 and the second sidewall spacer 150A, 150B, 150C. These metal silicide layers 180a-180c can be nickel silicide layers, cobalt silicide layers, titanium silicide layers or any other suitable type of metal silicide layers.

As mentioned above, the semiconductor structure 100A, 100B, 100C can include multiple CTSS-NVM devices 110A, 110B, 110C. Optionally, adjacent CTSS-NVM devices 110A, 110B, 110C can share the same raised source/drain region, as illustrated. Alternatively, adjacent CTSS-NVM devices can have discrete raised source/drain region, which are physically separated (e.g., by isolation regions) (not shown).

In operation, different biasing conditions can be applied to the gate structure 115 of a given CTSS-NVM device through the metal silicide layer 180c, to the raised source/drain region through the metal silicide layer 180b and to the Schottky barrier diode through the metal silicide layer 180a in order to: (a) force a charge into the third spacer layer 153 and, particularly, into the charge-trapping dielectric material of the second sidewall spacer 150A, 150B, 150C, thereby programming the CTSS-NVM device 110A, 110B, 110C (e.g., storing a "1" data bit); (b) remove a charge from the third spacer layer 153 of the second sidewall spacer 150A, 150B, 150C, thereby erasing the CTSS-NVM device 110A, 110B, 110C (i.e., storing a "0" data bit); or (c) read the state of the CTSS-NVM device 110A, 110B, 110C, as programmed or erased. For example, if 0V is applied to the raised source/drain region through the metal silicide layer 180b, a positive voltage is applied to the gate structure 115 through the metal silicide layer 180c, and the same positive voltage is applied to the Schottky barrier diode through the metal silicide layer 180a, channel hot electrons (CHEs) can flow from the raised source/drain region through the channel region 108 of the semiconductor substrate 103 immediately below the gate structure 115 and into the third spacer layer 153 of the second sidewall spacer 150A, 150B, 150C. Thus, a charge is trapped within the charge-trapping dielectric material of the third spacer layer 153 and the CTSS-NVM device 110A, 110B, 110C is programmed. It should be noted that, due to the relatively long third maximum width 173 of the third spacer layer 153 (e.g., >15 nm), the required charge-trapping for programming can occur. If 0V is applied to the raised source/drain region through the metal silicide layer 180b, a negative voltage is applied to the gate structure 115 through the metal silicide layer 180c, and the same negative voltage is applied to the Schottky barrier diode through the metal silicide layer 180a, holes can flow into the third spacer layer 153 of the second sidewall spacer 150A, 150B, 150C. Thus, the charge is released from the charge-trapping material of the third spacer layer 153 and the CTSS-NVM device 110A, 110B, 110C is erased. If 0V is applied to the raised source/drain region through the metal silicide layer 180b and a read voltage is applied to the gate structure 115 through the metal silicide layer 180c, current through the Schottky barrier diode can be sensed at the metal silicide layer 180a with a relatively low current indicating that the CTSS-NVM device 110A, 110B, 110C has been programmed (i.e., stores a "1" data bit) and with a relatively high current indicating that the CTSS-NVM device 110A, 110B, 110C has been erased (i.e., stores a "0" data bit). It should be understood that these biasing conditions are provided for illustration purposes and are not intended to be limiting. Those skilled in the art will recognize that various different alternative biasing schemes could be employed to achieve the desired programming, erasing and/or reading of a CTSS-NVM device.

As discussed in greater detail below with regard to the method embodiments, formation of such CTSS-NVM devices 110A, 110B, 110C can be integrated with the formation of other semiconductor devices. For example, optionally, in an embodiment where the semiconductor structure 100A, 100B, 100C is a hybrid structure, one or more semiconductor-on-insulator devices (e.g., one or more fully-depleted semiconductor-on-insulator FETs 190) can be in a semiconductor-on-insulator area 102. Each FET 190 can include a gate structure 195 on the semiconductor-on-insulator layer 105 above a channel region 191. The channel region 191 can be undoped or, optionally, doped. Symmetric sidewall spacers 196 can on the opposing sidewalls of the gate structure 195 and the symmetric sidewall spacers 196 can be essentially identical to the first sidewall spacer 116 of the CTSS-NVM device. Each FET 190 can further include semiconductor layers 192 (e.g., in-situ doped epitaxial semiconductor layers) for raised source/drain regions on the semiconductor-on-insulator layer 105 such that the gate structure 195 is positioned laterally between the source/drain regions and physically separated therefrom by the symmetric sidewall spacers 196. Optionally, adjacent FETs 190 can share a raised source/drain region, as illustrated. Alternatively, adjacent FETs can have discrete raised source/drain regions, which are physically separated (e.g., by isolation regions) (not shown). Each FET 190 can further include metal silicide layers 180 (e.g., nickel silicide layers, cobalt silicide layers, titanium silicide layers or any other suitable type of metal silicide layers) on the top surfaces of the semiconductor layers 192 and the gate structure 195.

The semiconductor structure 100A, 100B, 100C can further include one or more conformal dielectric layers covering the CTSS-NVM device(s) 110A, 110B, 110C and further covering any other semiconductor devices on the semiconductor substrate (e.g., covering FETs 190 in a semiconductor-on-insulator area 102, if applicable). These conformal dielectric layers can include, for example: a conformal dielectric layer 181 of the second dielectric material (e.g., silicon dioxide (SiO$_2$)) and another conformal dielectric layer 182 of the third dielectric material (e.g., silicon nitride (SiN)) on the conformal dielectric layer 182. The semiconductor structure 100A, 100B, 100C can further include one or more middle-of-the-line (MOL) dielectric layers on the conformal dielectric layer 182 and MOL contacts extending through the MOL dielectric layer(s) and the conformal dielectric layers to the terminals of the various devices.

Also disclosed herein are embodiments of a method of forming the above-described semiconductor structure embodiments 100A of FIG. 1A, 100B of FIG. 1B and 100C of FIG. 1C. Generally, each of the method embodiments can include providing a semiconductor substrate and forming one or more CTSS-NVM device on the semiconductor substrate. Optionally, the process steps for forming CTSS-NVM device(s) on the semiconductor substrate can be integrated with processes for forming other types of devices, as described in greater detail below. In any case, forming the CTSS-NVM device can include forming a gate structure on the semiconductor substrate adjacent to a channel region within the semiconductor substrate. Forming the CTSS-NVM device can further including forming asymmetric sidewall spacers on opposing sidewalls of the gate structure. Specifically, a first sidewall spacer with a first width can be formed on a first sidewall of the gate structure. Additionally, a second sidewall spacer with a second width that is greater than the first width can be formed on a second sidewall of the gate structure opposite the first sidewall. The second sidewall spacer can further be formed so as to include a charge-trapping material. For example, the second sidewall spacer can be formed so as to include multiple dielectric spacer layers. One of the dielectric spacer layers can be made of the charge-trapping dielectric material and, depending upon the particular method embodiment, can be tapered (i.e., can be essentially D-shaped or backwards D-shaped, depending upon the side of the gate structure) or, alternatively, can have first and second segments that are parallel to the gate structure and semiconductor substrate, respectively (i.e., can be essentially L-shaped or backwards L-shaped, depending upon the side of the gate structure). In any case, the second sidewall spacer can be formed so that the dielectric spacer layer made of the charge-trapping dielectric material has a bottom end (i.e., the end closest to the semiconductor substrate) with a maximum width that is sufficient to achieve the charge-trapping required for proper CTSS-NVM device operation. Forming the CTSS-NVM device can further include, after completing formation of the first sidewall spacer and before completing formation of the second sidewall spacer, forming a semiconductor layer for a source/drain region (e.g., an in-situ doped epitaxial semiconductor layer) on the semiconductor substrate adjacent to the first sidewall spacer. Forming the CTSS-NVM device can further include, after completing formation of the second sidewall spacer, forming an additional layer comprising a metal (e.g., a metal silicide layer) for a Schottky barrier diode on the semiconductor substrate adjacent to the second sidewall spacer.

Figure 2:
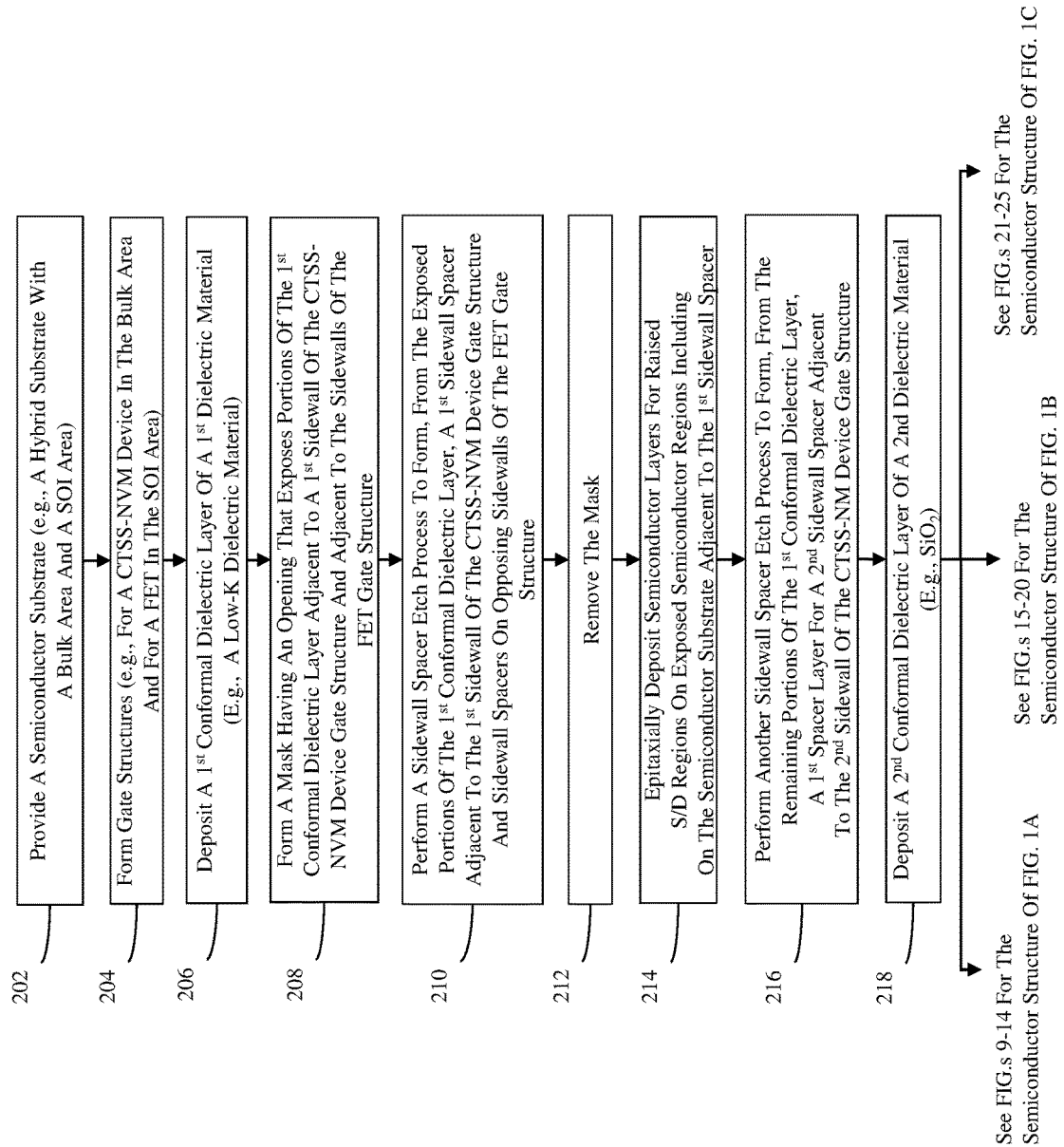
FIG. 2 is a flow diagram illustrating preliminary process steps used to form the semiconductor structure embodiments of FIGS. 1A, 1B and 1C.

More particularly, FIG. 2 is a flow diagram illustrating the same initial process steps performed in all of the method embodiments. Specifically, the method embodiments can begin by providing a semiconductor substrate 103 (see process step 202 and FIG. 3). The semiconductor substrate can be a bulk semiconductor substrate (e.g., a bulk silicon substrate). Alternatively, the semiconductor substrate can be a hybrid substrate that includes one or more bulk semiconductor areas 101 (e.g., bulk silicon area(s)) and one or more semiconductor-on-insulator area 102 (e.g., silicon-on-insulator (SOI) area(s)). The hybrid structure can include a semiconductor substrate 103 (e.g., a silicon substrate) with one or more bulk semiconductor area(s) 101 (e.g., bulk silicon area(s)) and with one or more semiconductor-on-insulator areas 102 (e.g., silicon-on-insulator (SOI) area(s)) adjacent to the bulk semiconductor area(s) 101. The semiconductor-on-insulator area(s) 102 can include: an insulator layer 104 (e.g., a buried oxide layer or other suitable insulator layer) immediately adjacent to the top surface of the semiconductor substrate 103; and a semiconductor-on-insulator layer 105 (e.g., a silicon-on-insulator (SOI) layer or other suitable semiconductor-on-insulator layer), which is relatively thin (e.g., 20 nm or less, preferably 4-12 nm) and which is immediately adjacent to the top surface of the insulator layer 104).

Figure 3:
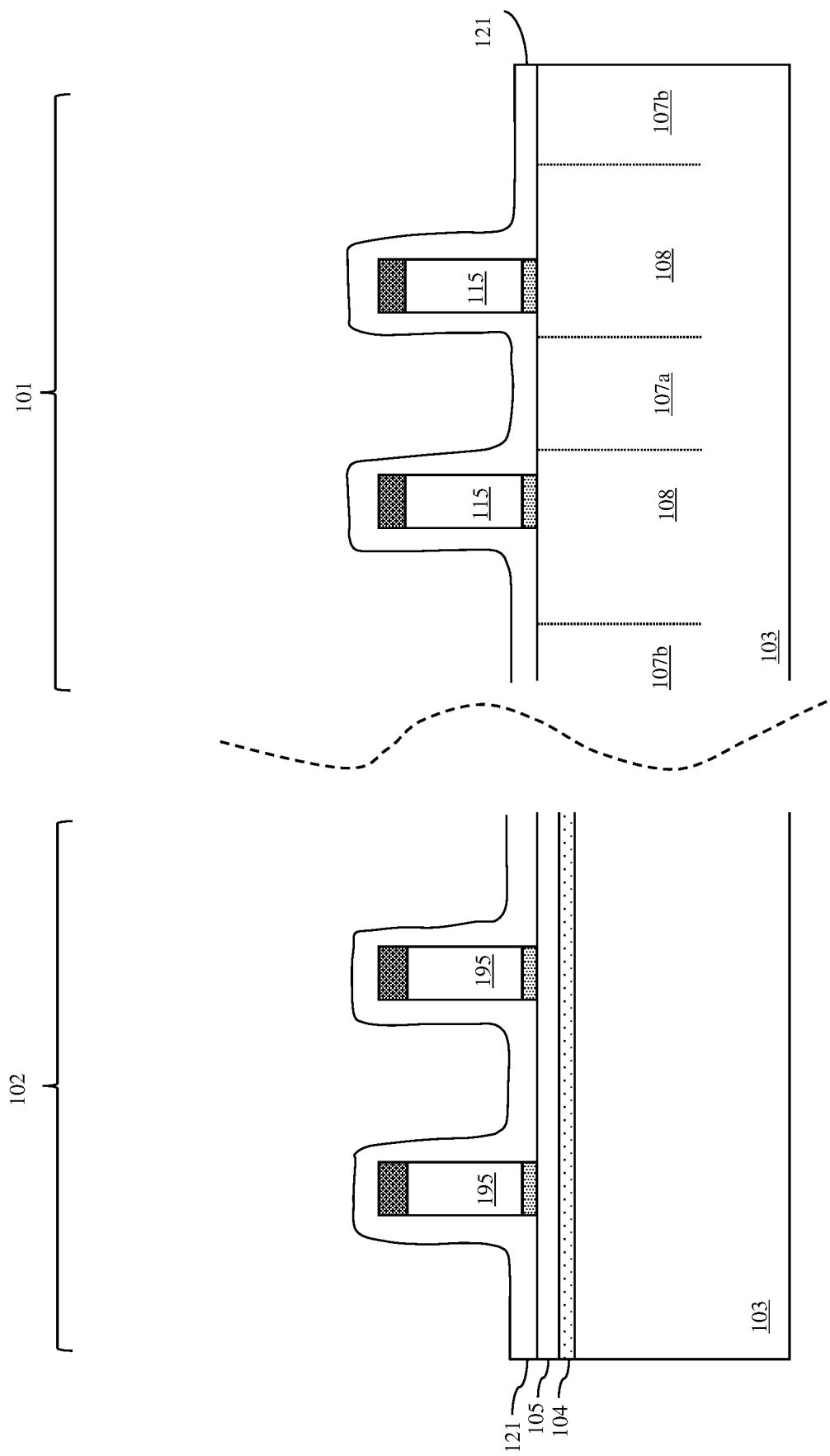
FIGS. 3-8 are cross-section diagrams illustrating partially completed semiconductor structures formed according to the flow diagram of FIG. 2.

The method embodiments can further include forming gate structure(s) 115 for one or more CTSS-NVM devices on the semiconductor substrate (e.g., on a bulk semiconductor area 101 of a hybrid substrate) (see process step 204 and FIG. 3). Optionally, gate structure(s) 195 for one or more field effect transistors (FETs) can be concurrently formed on the semiconductor substrate (e.g., fully-depleted semiconductor-on-insulator FETs can be concurrently formed on the semiconductor-on-insulator layer 105 of a semiconductor-on-insulator area 102 of a hybrid substrate). For purposes of illustration, the method is described below with respect to formation on a hybrid substrate. It should be understood that discussion of the use of a hybrid substrate is not intended to be limiting and that, alternatively, any suitable substrate could be employed.

In any case, gate structure formation can include: forming one or more gate dielectric layers on the semiconductor substrate; forming one or more gate conductor layers on the gate dielectric layer(s); forming a dielectric gate cap layer on the gate conductor layer(s); and performing conventional lithographic patterning and anisotropic etch techniques to form discrete gate structures on channel regions (e.g., in the semiconductor substrate 103 for the CTSS-NVM device(s) and in the semiconductor-on-insulator layer 105 for the FET(s)). In one exemplary embodiment, the gate dielectric layer(s) can include a thin silicon dioxide ($SiO_2$) layer and a thin high-K dielectric layer on the $SiO_2$ gate dielectric layer. The high-K dielectric layer can be a hafnium (Hf)-based dielectric (e.g., hafnium oxide, hafnium silicon oxide, hafnium silicon oxynitride, hafnium aluminum oxide, etc.) or some other suitable high-K dielectric (e.g., aluminum oxide, tantalum oxide, zirconium oxide, etc.). In the exemplary embodiment, the gate conductor layer(s) can include a thin titanium nitride (TiN) layer on the high-K gate dielectric layer, and an amorphous silicon (A-Si) layer on the TiN layer. It should be understood that the gate dielectric and conductor material layers mentioned-above are provided for illustration purposes and are not intended to be limiting. Alternatively, any other suitable gate dielectric and conductor material layers could be incorporated into the gate structure of the disclosed CTSS-NVM device.

The lithographic patterning and etch processes can be performed at process step 204 such that each gate structure 115, 195 has opposing sidewalls (i.e., a first sidewall and a second sidewall opposite the first sidewall). The opposing sidewalls can extend away from the top surface of the semiconductor substrate (e.g., in the Y-direction) such that they are essentially parallel to each other and essentially perpendicular to the top surface of the semiconductor substrate. The terms "essentially parallel" and "essentially perpendicular" are used to account for processing variations that: (a) may result in the opposing sidewalls being somewhat angled relative to the top surface of the semiconductor substrate (e.g., at 90 degrees plus or minus 0-20 degrees) as opposed to exactly perpendicular; (b) may result in the opposing sidewalls being somewhat curved as opposed to being exactly planar; and/or (c) may result in the top surface of the semiconductor substrate not being exactly planar.

A first conformal dielectric layer 121 of a first dielectric material can be deposited over the partially completed semiconductor structure (see process step 206 and FIG. 3). The first dielectric material can be, for example, a low-K dielectric material. For purposes of this disclosure, a "low-K dielectric material" refers to a dielectric material with a dielectric constant that is less than that of silicon nitride (i.e., less than 7). Exemplary low-K dielectric materials that could be employed include, but are not limited to, silicon-boron-carbon-nitride (SiBCN), silicon-oxygen-carbon-nitride (SiONC), silicon-carbon-nitride (SiCN), silicon oxycarbide (SiCO), and hydrogenated silicon oxycarbide (SiCOH). The first conformal dielectric layer can be relatively thin (e.g., 3-15 nm).

Figure 4:
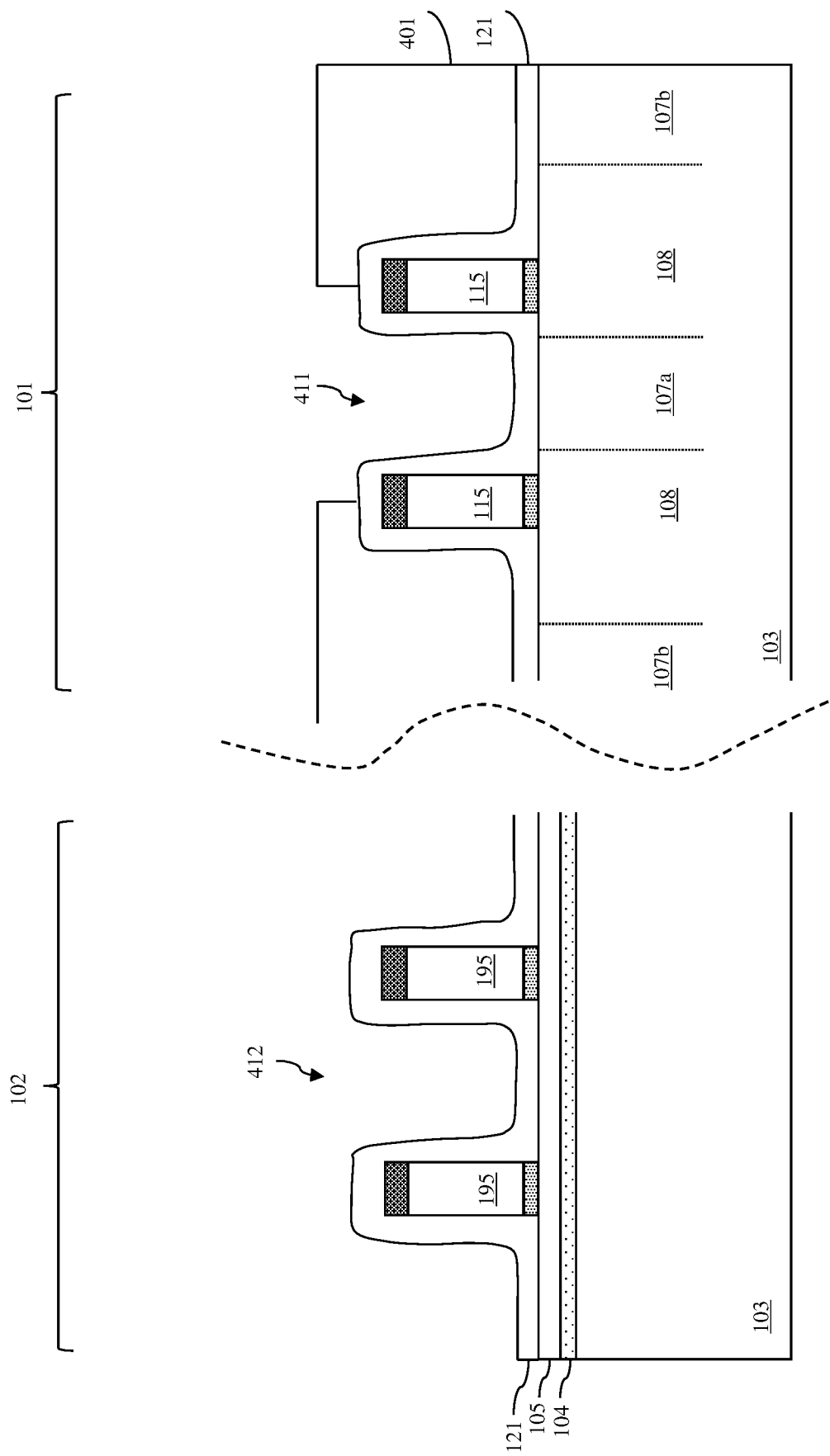

A mask layer 401 can be formed on the first conformal dielectric layer 121 and patterned (e.g., using conventional lithographic patterning and etch techniques) with openings 411-412. (see process step 208 and FIG. 4). For example, for each partially completed CTSS-NVM device in the bulk semiconductor area, an opening 411 can be patterned into the mask layer 401 so as to expose a first portion of the first conformal dielectric layer 121. The opening 411 and the first portion of the first conformal dielectric layer can be over a first side of the gate structure 115 and can further extend laterally over the region 107a of the semiconductor substrate 103 that is adjacent to the first side. The mask layer 401 can remain covering a second portion of the first conformal dielectric layer 121 on a second side of the gate structure 115 and further extending laterally over the region 107b of the semiconductor substrate 103 that is adjacent to that second side. Opening 412 can expose the portion of the first conformal dielectric layer 121 over the partially completed FETs in the semiconductor-on-insulator area 102.

Figure 5:
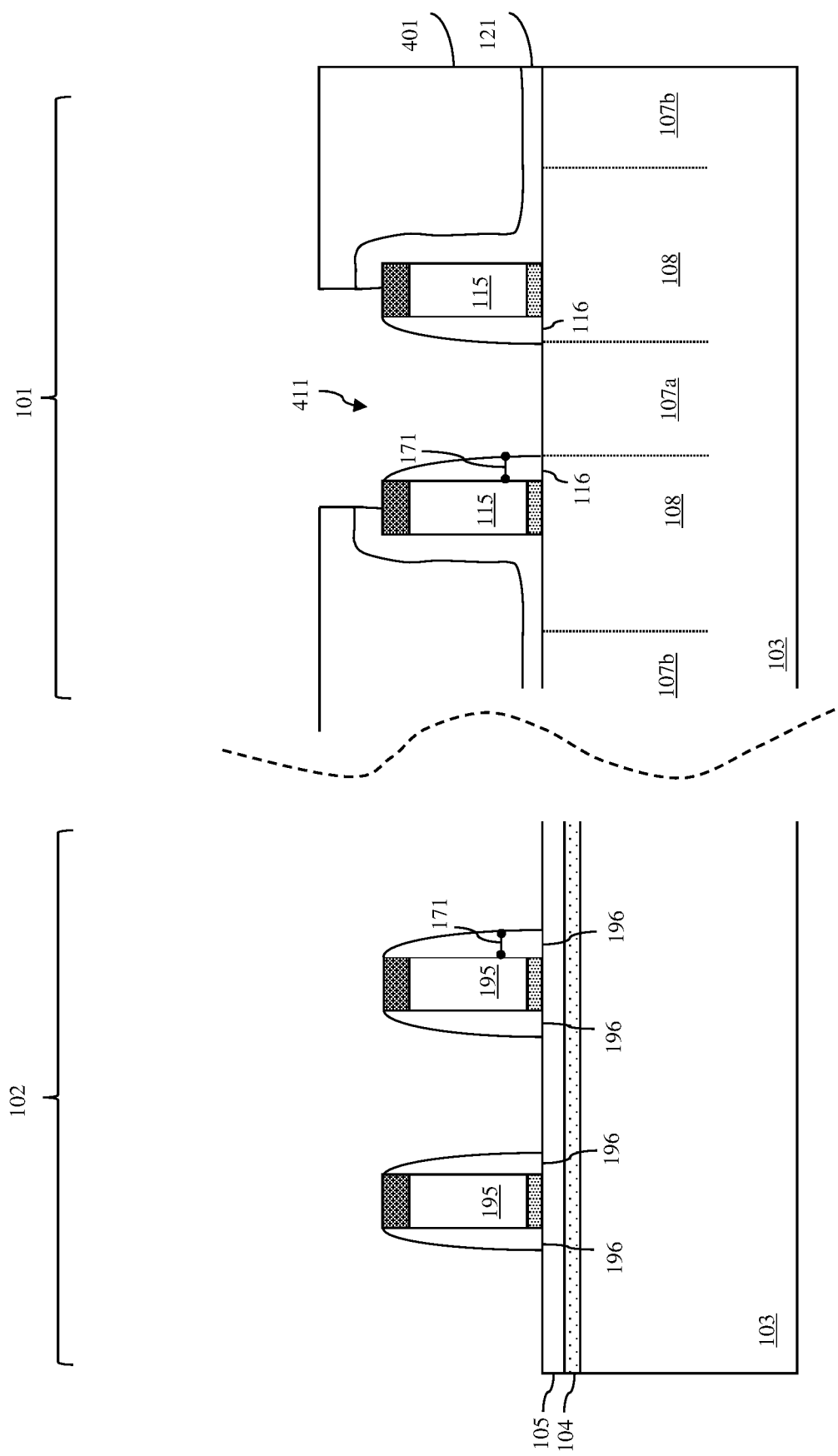

A conventional sidewall spacer etch process (e.g., a selective anisotropic etch process) can be performed so as to form sidewall spacers from vertical portions of the exposed first conformal dielectric layer 121 (see process step 210 and FIG. 5). As a result, for each partially completed CTSS-NVM device in the bulk semiconductor area 101, a first sidewall spacer 116 will be formed from the first portion of the first conformal dielectric layer 121. The first sidewall spacer 116 will have a first maximum width 171, as measured from the first sidewall of the gate structure 115 in the X-direction, which, as illustrated in the drawings, is essentially parallel to the top surface of the semiconductor substrate 103. The first maximum width 171 can be, for example, 3-15 nm or approximately equal to the deposited thickness of the first conformal dielectric layer 121. Additionally, for each partially completed FET in the semiconductor-on-insulator area 102, opposing sidewall spacers 196 will be formed. It should be noted that this sidewall spacer etch process will also result in exposure of semiconductor surfaces in the bulk semiconductor area 101 and positioned laterally adjacent to the first sidewall spacer 116 of each partially completed CTSS-NVM device (e.g., the top surface of the region 107a of the semiconductor substrate 103) and in the semiconductor-on-insulator area 102 and positioned laterally adjacent to the opposing sidewall spacers 196 of each partially completed FET (e.g., the top surface of the regions of the semiconductor-on-insulator layer 105 positioned laterally adjacent to the opposing sidewall spacers 196).

The mask layer 401 can be selectively removed (see process step 212). It should be noted that, for each partially completed CTSS-NVM device, the region 107b of the semiconductor substrate 103 that is adjacent to the second side of the gate structure 115 will still be covered by a remaining portion of the first conformal dielectric layer 121 at this point in the process. Optionally, removal of the mask layer 401 can be performed after process step 214 below.

Figure 6:
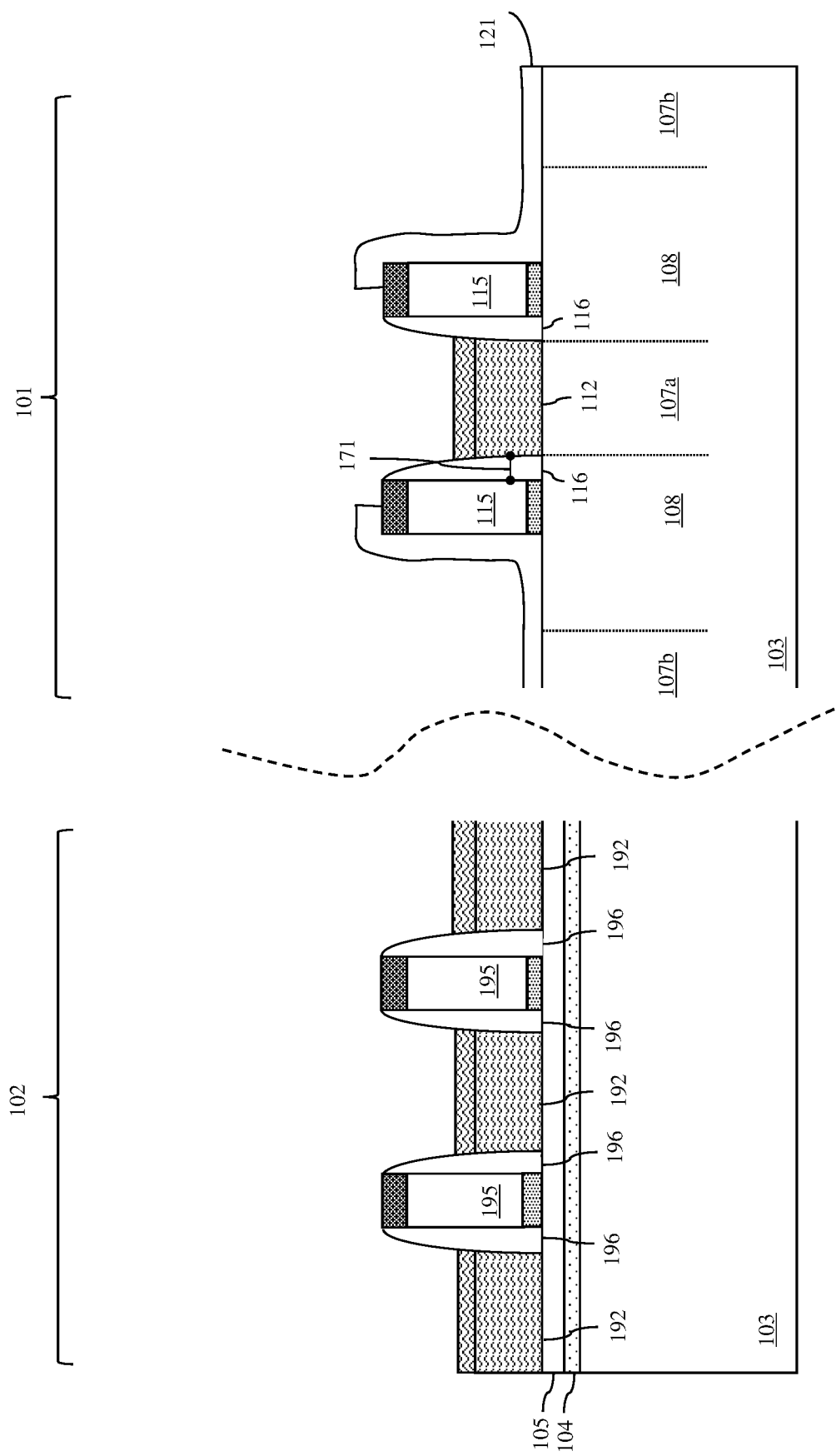

Semiconductor layers for raised source/drain regions can subsequently be deposited (e.g., epitaxially grown) onto exposed semiconductor surfaces (see process step 214 and FIG. 6). The semiconductor layers can include, for each partially completed CTSS-NVM device in the bulk semiconductor area 101, a semiconductor layer 112 on the top surface of the semiconductor substrate 103 above the region 107a adjacent to the first sidewall spacer 116. The semiconductor layers can further include, for each partially FET in the semiconductor-on-insulator area, semiconductor layers 192 on the top surface of the semiconductor-on-insulator layer 105 adjacent to the opposing sidewall spacers 196. For P-type devices, the semiconductor layers can be epitaxial silicon, epitaxial silicon germanium or some other suitable epitaxial semiconductor material and can be in-situ doped or, alternatively, subsequently implanted so as to have a P-type conductivity at a relatively high conductivity level. For N-type devices, the semiconductor layers can be epitaxial silicon or some other suitable epitaxial semiconductor material and can be in-situ doped or, alternatively, subsequently implanted so as to have an N-type conductivity at a relatively high conductivity level. In one exemplary embodiment, the CTSS-NVM device(s) and optionally the FET(s) being formed can be P-type device and the semiconductor layers deposited at process step 214 can be boron-doped epitaxial silicon germanium (SiGeB) immediately adjacent to the semiconductor surface and, optionally, an epitaxial silicon germanium carbide (SiGeC) on the SiGeB layer.

Figure 7:
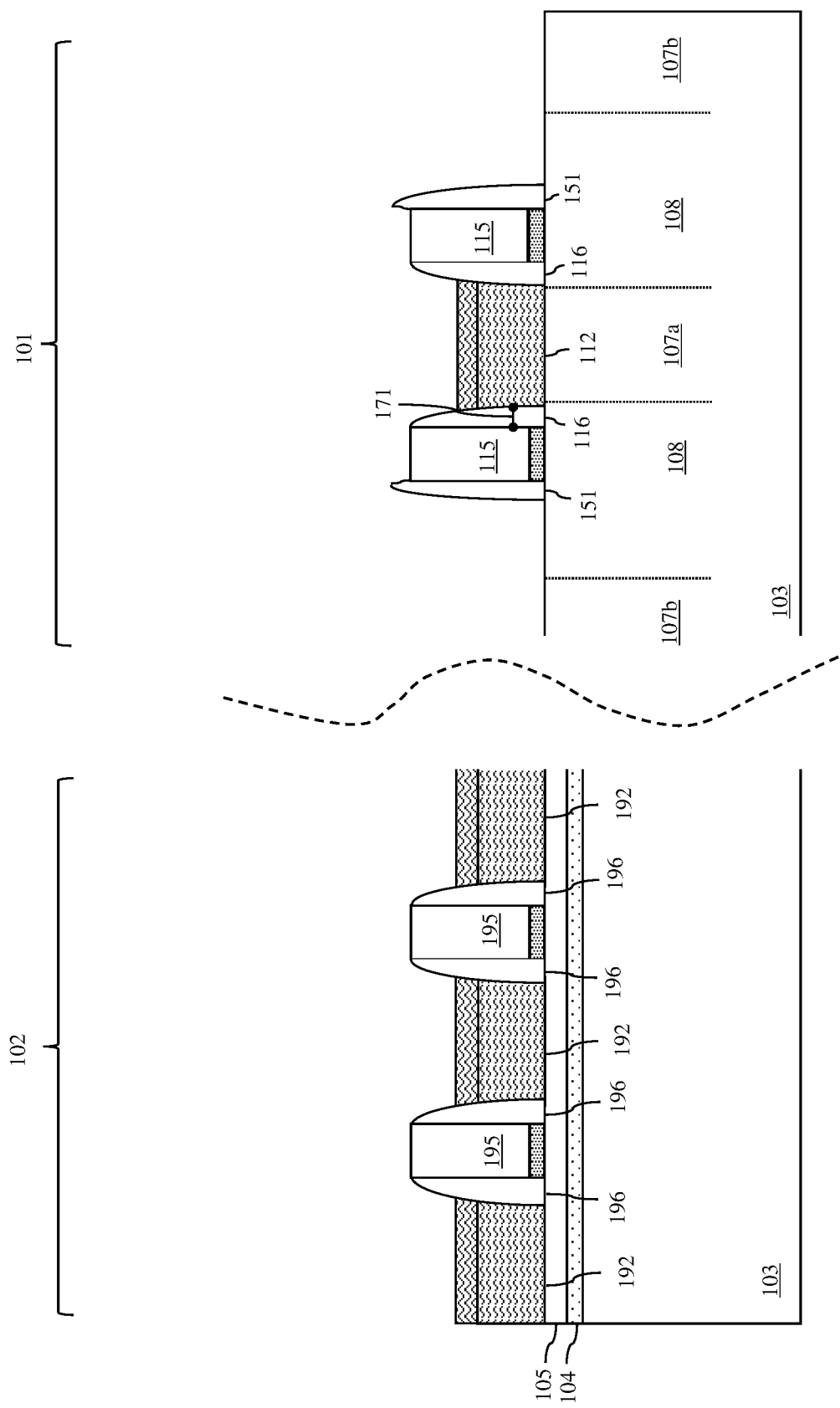

Another conventional sidewall spacer etch process (e.g., a selective anisotropic etch process) can be performed so as to form, from a vertical portion of a remaining portion of the first conformal dielectric layer 121 for each partially completed CTSS-NVM device, a first spacer layer 151 for a second sidewall spacer on a second sidewall of the gate structure 115 (see process step 216 and FIG. 7). As a result, the first spacer layer 151 can be similar to the first sidewall spacer 116 in terms of dielectric spacer material(s) used. The first spacer layer 151 will be positioned laterally immediately adjacent to the second sidewall of the gate structure and oriented in the Y-direction, extending away from the semiconductor substrate 103 such that it covers the second sidewall of the gate structure 115. It should, however, be noted that the first sidewall spacer and the first spacer layer of the second sidewall spacer may not be symmetric. For example, the height of the first sidewall spacer, as measured from the top surface of the semiconductor substrate, may be less than the height of the first spacer layer 151 of the second sidewall spacer. However, the width should be approximately the same (e.g., approximately equal to the deposited thickness of the first conformal dielectric layer 121, e.g., 3-15 nm). As illustrated, the dielectric gate caps can also be selectively removed at process step 216.

Figure 8:
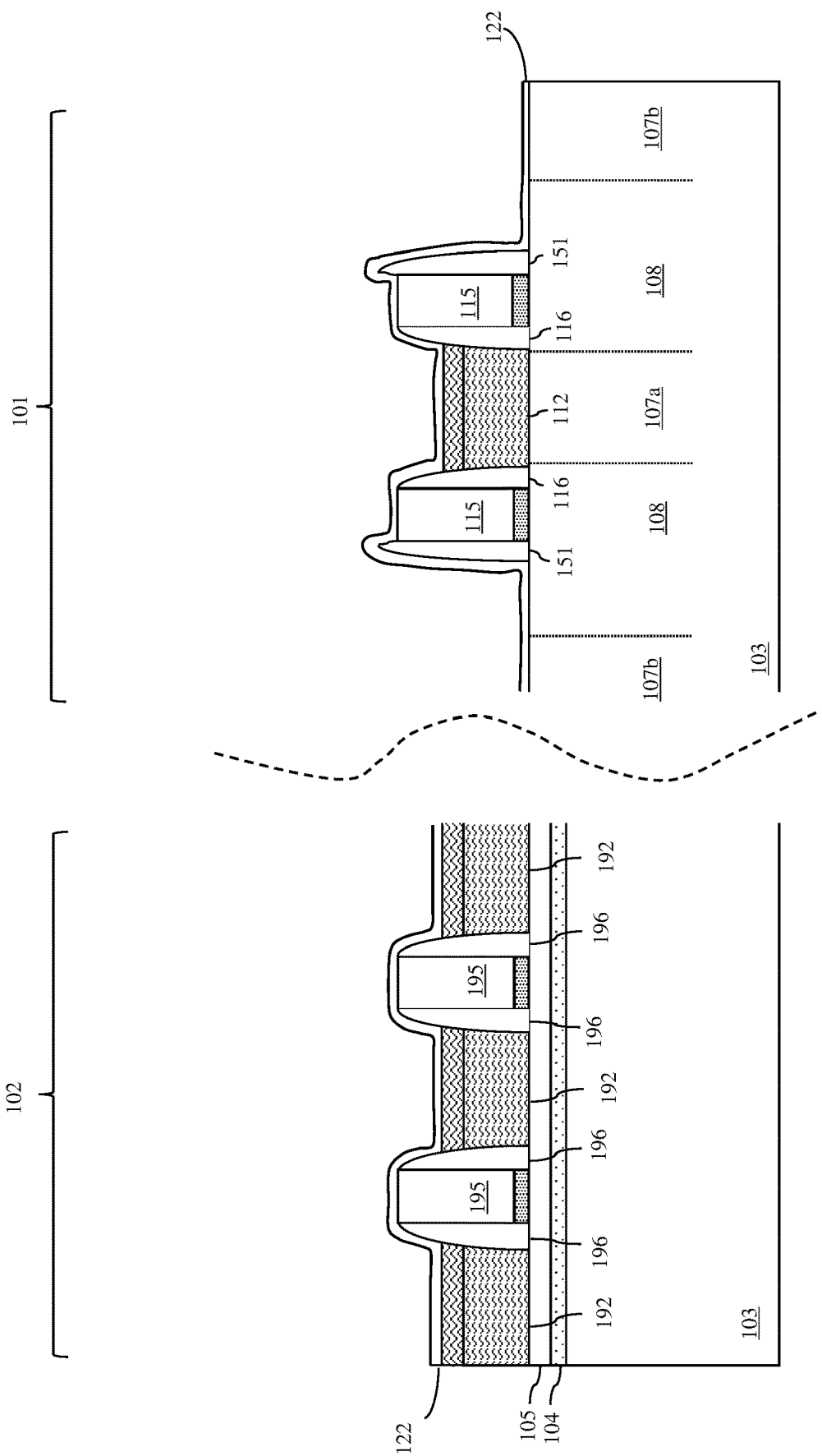

A second conformal dielectric layer 122 of a second dielectric material can subsequently be deposited over the partially completed semiconductor structure (see process step 218 and FIG. 8). The second dielectric material can be, for example, undoped silicon dioxide ($SiO_2$) or some other suitable dielectric material that is relatively thin (e.g., 2-6 nm) and different from the first dielectric material. It should be noted with integrated processing of CTSS-NVM devices on the bulk semiconductor area of a hybrid substrate and FDSOI FETs in the semiconductor-on-insulator area of the same hybrid substrate, this second conformal dielectric layer 122 can be, for example, the same OP oxide liner employed during conventional FDSOI FET processing.

Depending on the particular embodiment of the CTSS-NVM device being formed, the remaining process steps may vary. Specifically, the flow diagram of FIG. 9 and FIGS. 11-14 illustrate process steps that can be employed to form the semiconductor structure 100A with the CTSS-NVM device(s) 110A, as shown in FIG. 1A. The flow diagram of FIG. 15 and FIGS. 16-20 illustrate process steps that can be employed to form the semiconductor structure 100B with the CTSS-NVM device(s) 110B, as shown in FIG. 1B. The flow diagram of FIG. 21 and FIGS. 22-25 illustrate process steps that can be employed to form the semiconductor structure 100C with the CTSS-NVM device(s) 110C, as shown in FIG. 1C.

Figure 9:
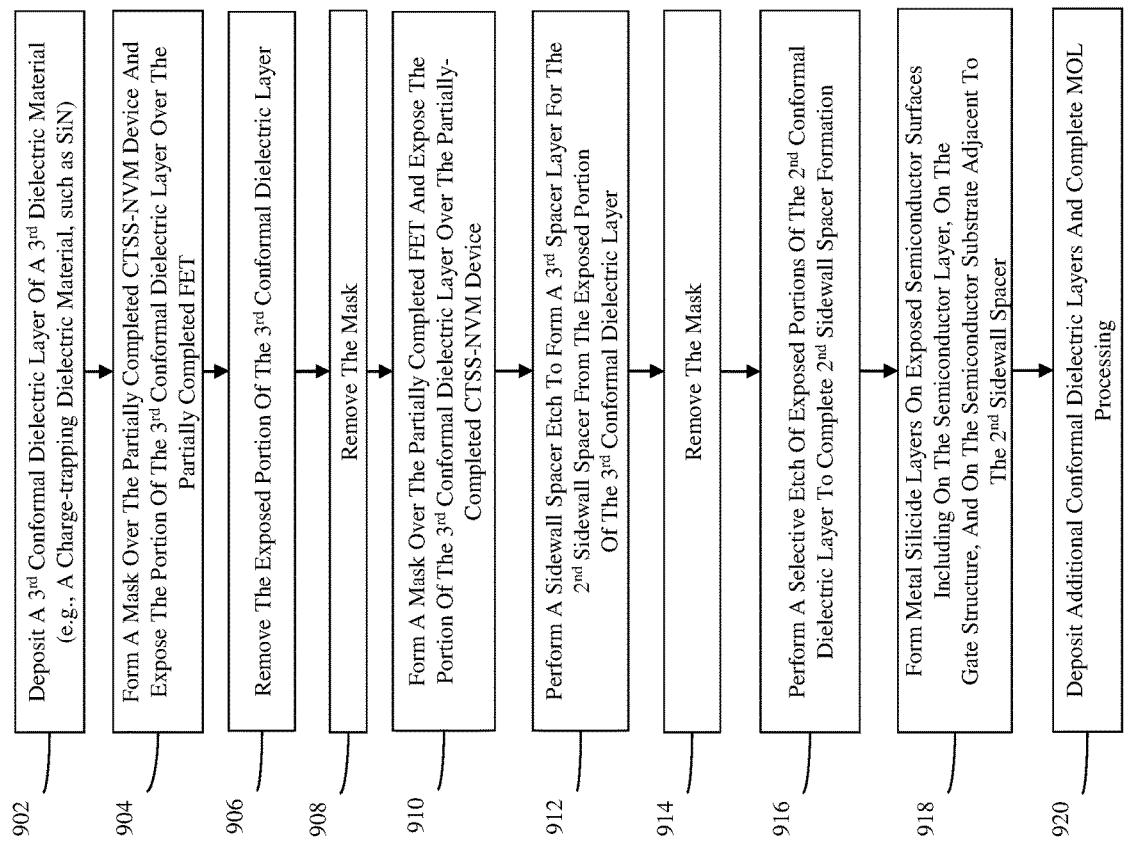
FIG. 9 is a flow diagram illustrating process steps used to form the semiconductor structure embodiment of FIG. 1A.
Figure 10:
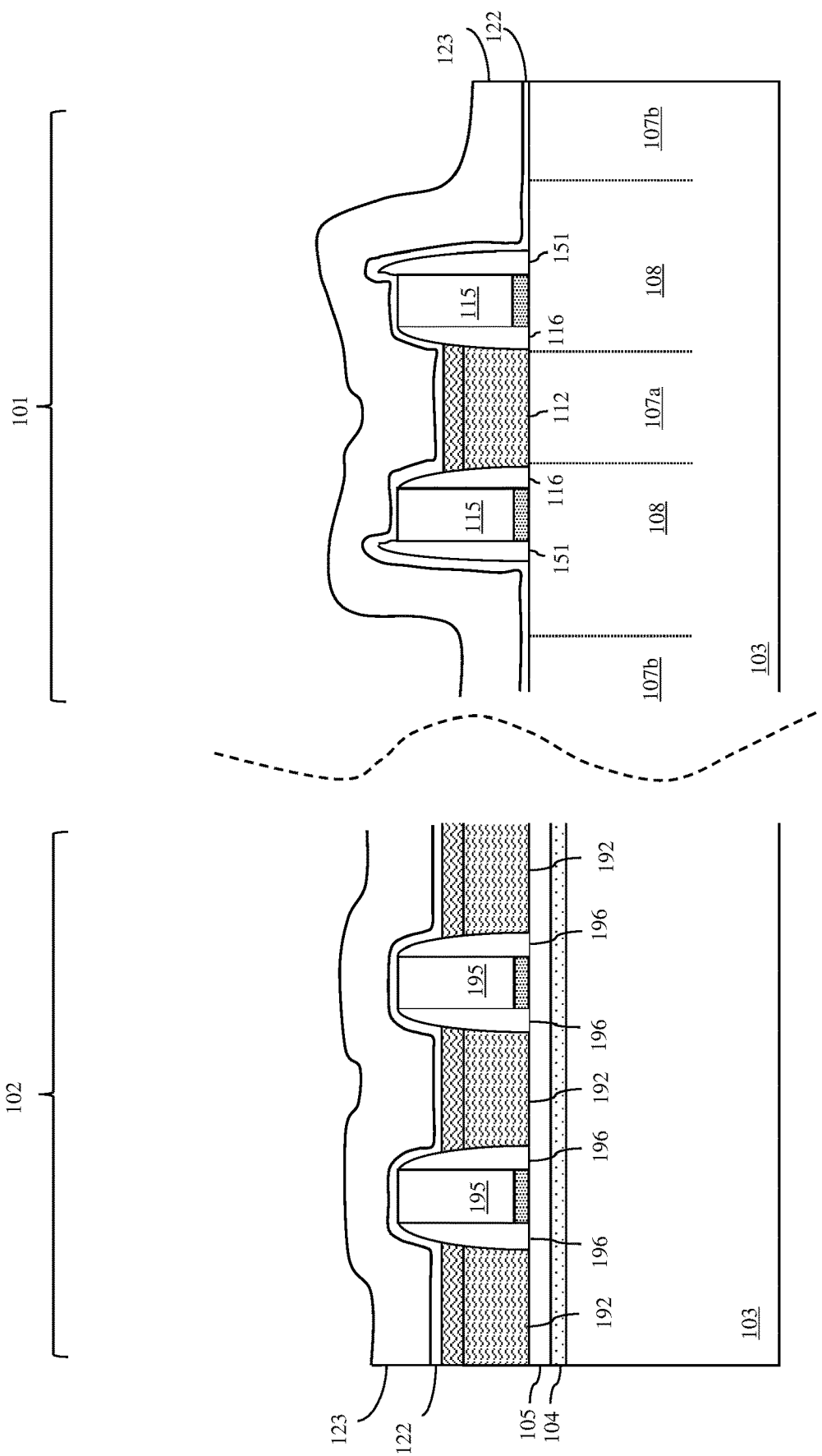
FIGS. 10-14 are cross-section diagrams illustrating partially completed semiconductor structures formed according to the flow diagram of FIG. 9.

Specifically, referring to the flow diagram of FIG. 9, in one embodiment of the method a third conformal dielectric layer 123 of a third dielectric material can be deposited on the second conformal dielectric layer 122 (see process step 902 and FIG. 10). The third dielectric material can be different from the first dielectric material and the second dielectric material and, more specifically, can be a charge-trapping dielectric material (e.g., silicon nitride (SiN) or some other suitable charge-trapping dielectric material). The third conformal dielectric layer 123 can be deposited so that it is relatively thick (e.g., 15-30 nm) and, more particularly, so that it is thicker than both the first conformal dielectric layer 121 and the second conformal dielectric layer 122.

Figure 11:
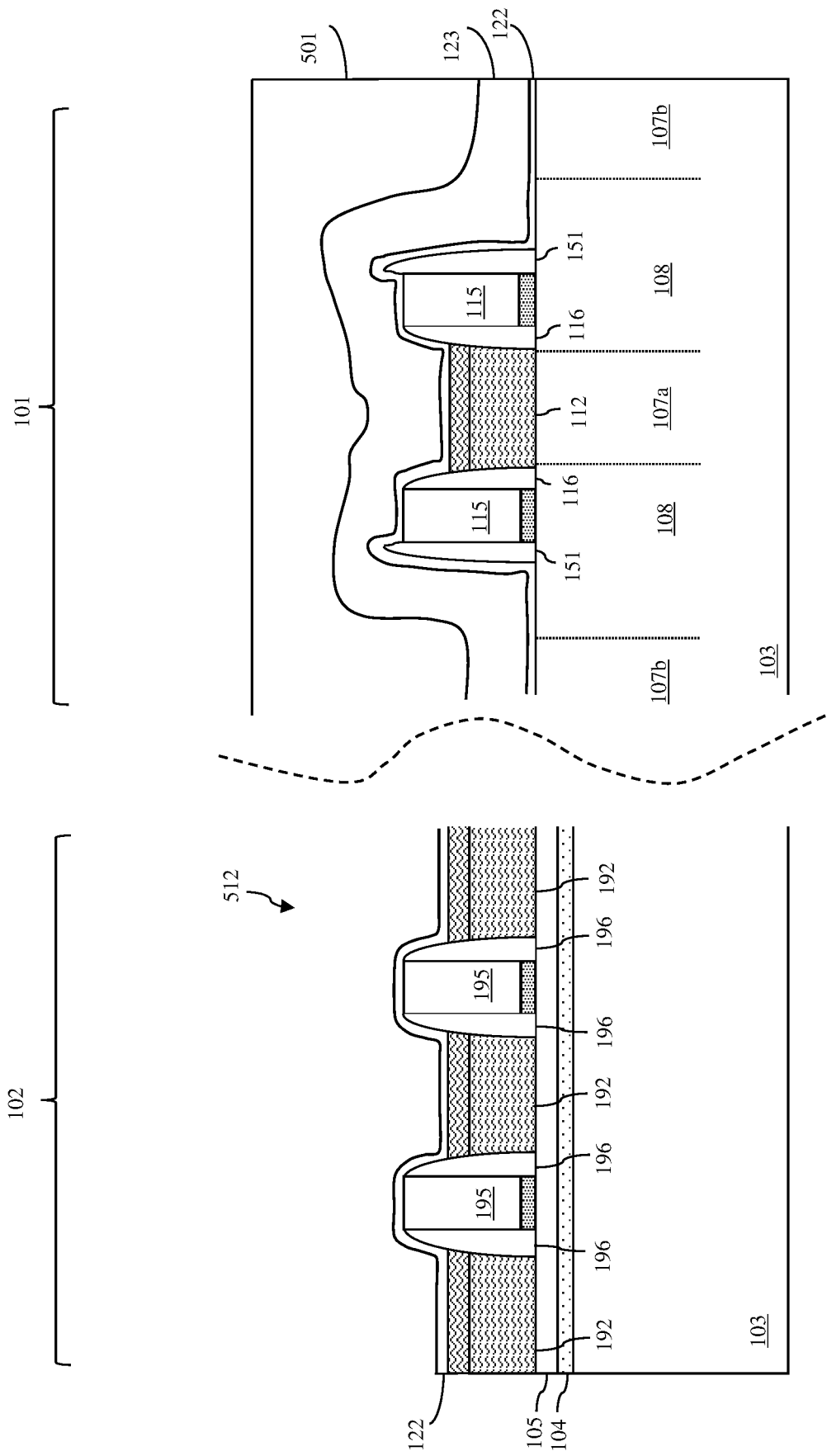

An additional mask layer 501 can be formed over the partially completed semiconductor structure and patterned (e.g., using conventional lithographic patterning and etch techniques) with an opening 512 (see process step 904 and FIG. 11). The opening 512 can expose the portion of the third conformal dielectric layer 123 in the semiconductor-on-insulator area 102 over the partially completed FET(s). The exposed portion of the third conformal dielectric layer 123 can subsequently be selectively removed (e.g., using an isotropic etch process that is selective for the charge-trapping dielectric material, e.g., selective for SiN) (see process step 906 and FIG. 11).

Figure 12:
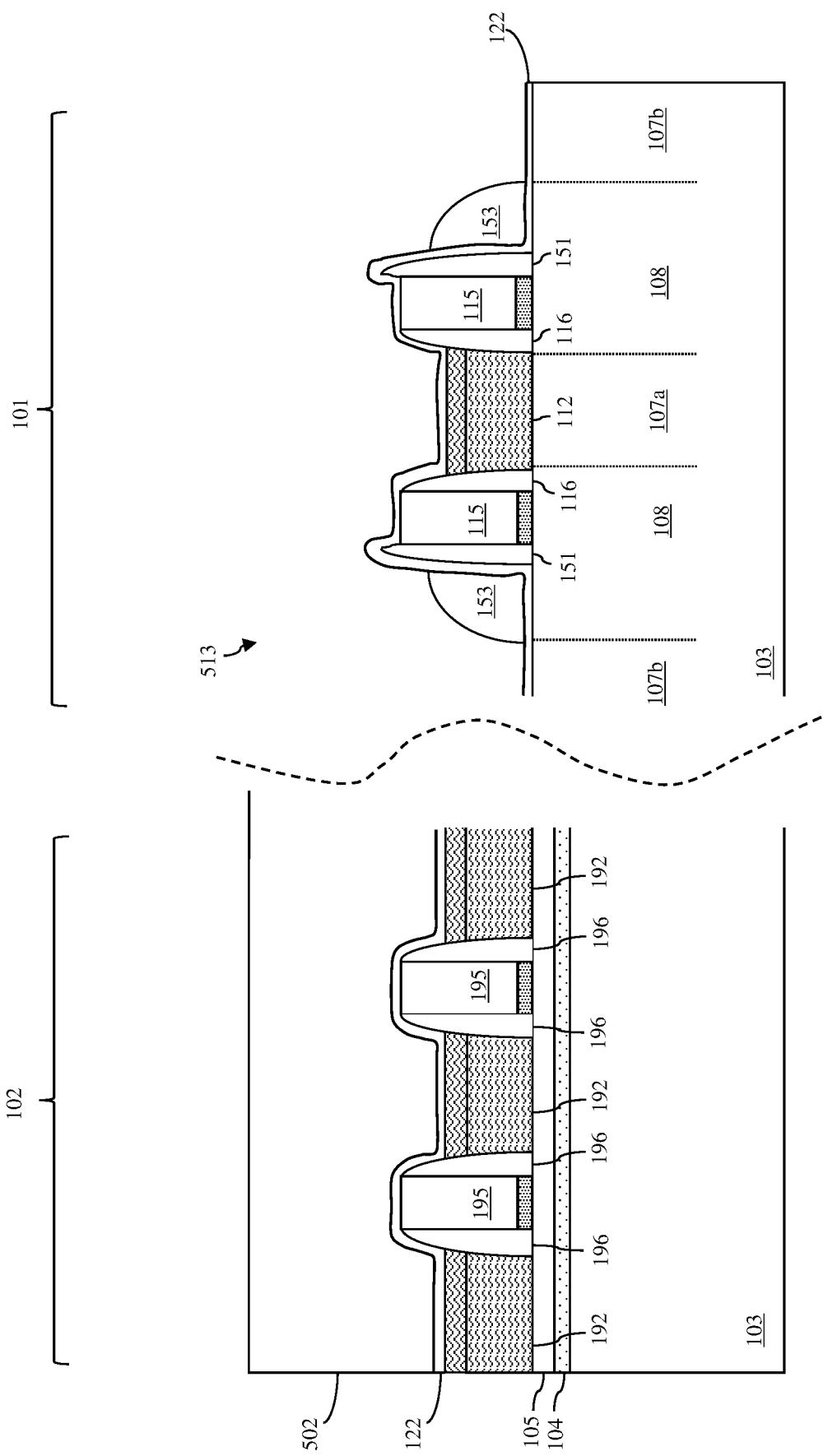

The additional mask layer 501 can then be selectively removed (see process step 908) and a second additional mask layer 502 can be formed over the partially completed semiconductor structure (see process step 910 and FIG. 12). The second additional mask layer 502 can be patterned (e.g., using conventional lithographic patterning and etch techniques) with an opening 513. The opening 513 can expose that portion of the third conformal dielectric layer 123 covering the partially completed CTSS-NVM device(s) in the bulk semiconductor area 101.

Another conventional sidewall spacer etch process (e.g., a selective anisotropic etch process) can be performed so as to form, from a vertical portion of the exposed portion of the third conformal dielectric layer 123 for each partially completed CTSS-NVM device, a third spacer layer 153 for the second sidewall spacer (see process step 912 and FIG. 12).

Figure 13:
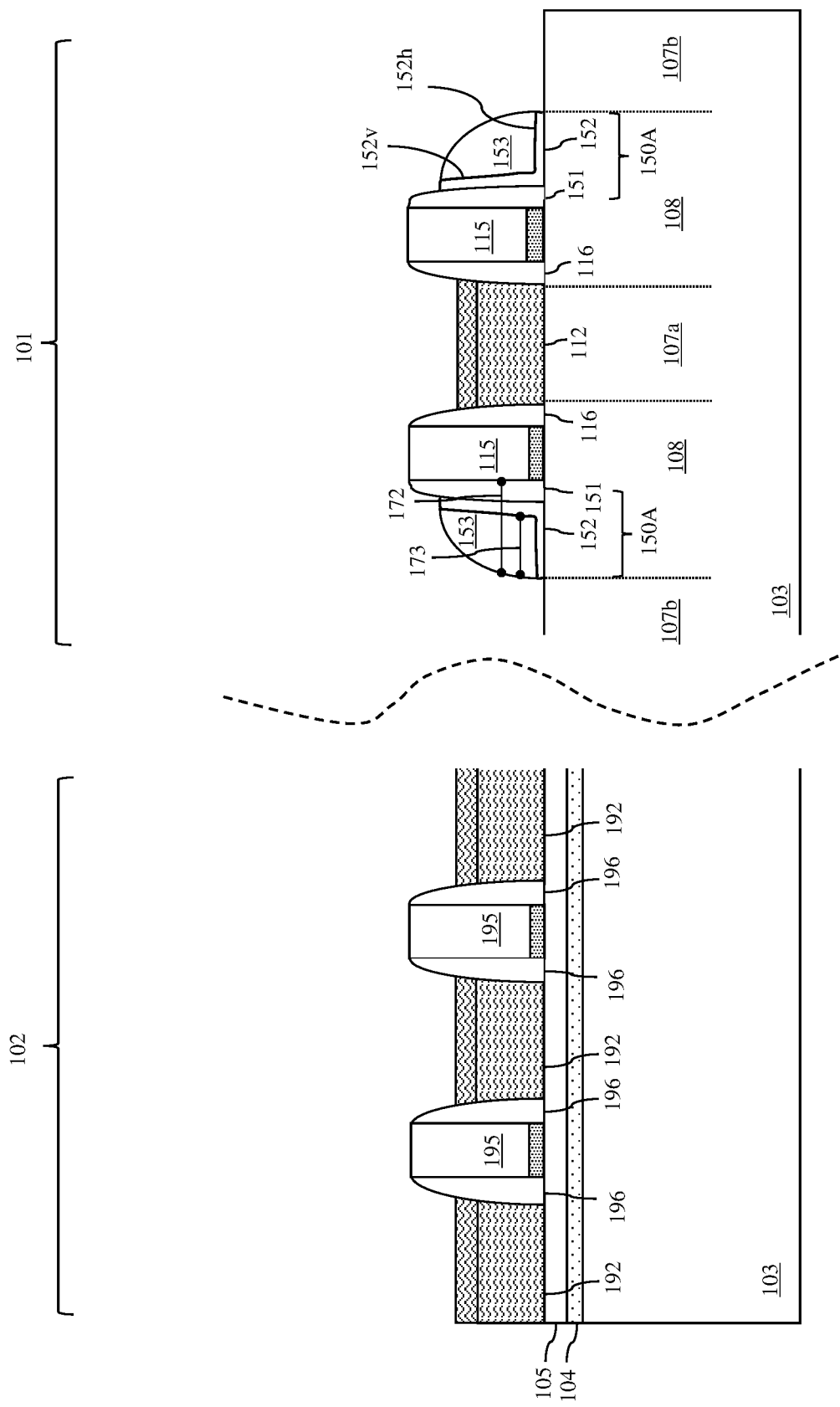
Figure 14:
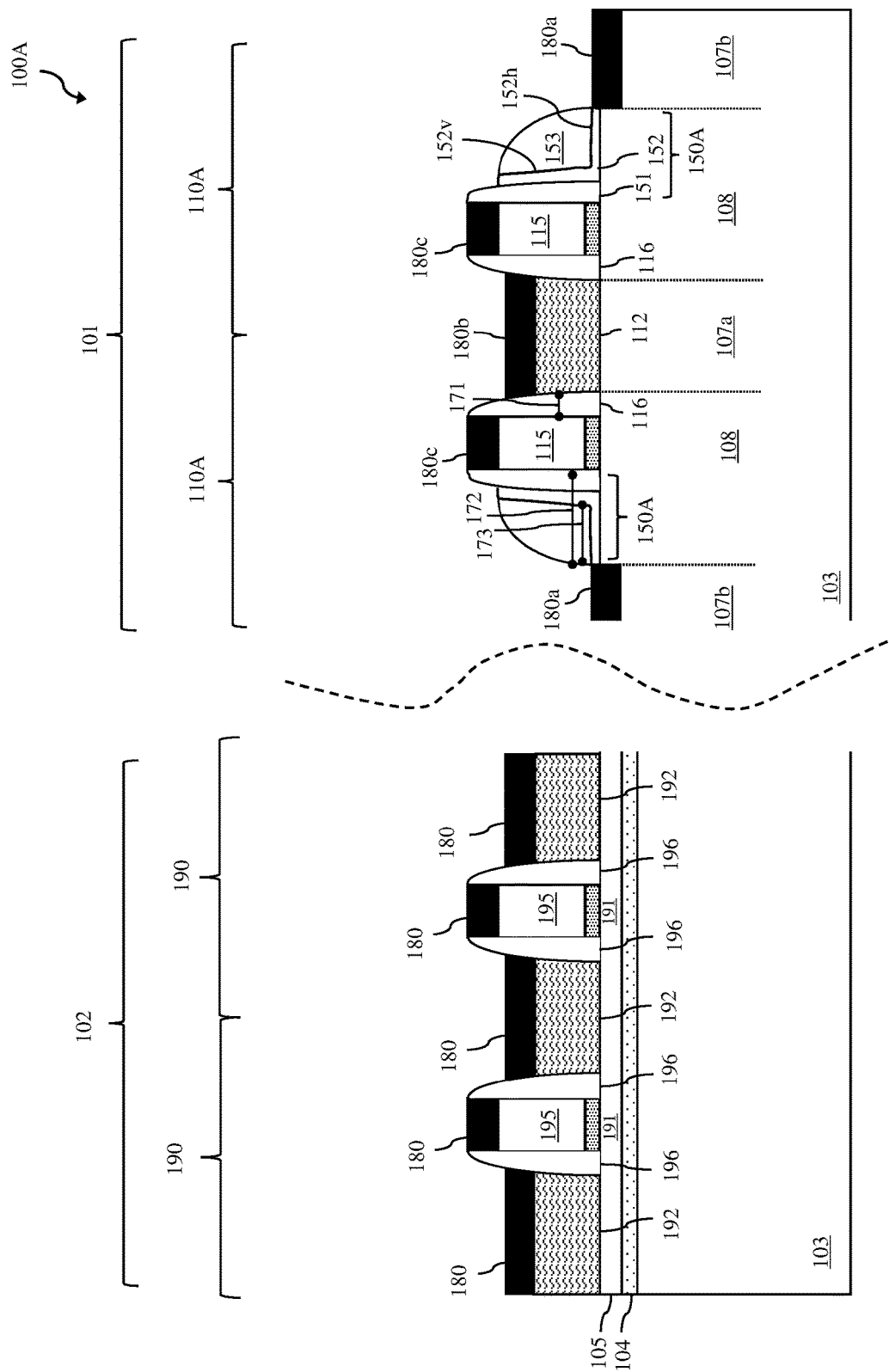

The second additional mask layer 502 can then be selectively removed (see process step 914) and additional processing can be performed in order to complete the second sidewall spacer 150A (see process step 916 and FIG. 13). Specifically, a selective etch process can be performed in order to selectively remove exposed portions of the second conformal dielectric layer 122 from the partially completed semiconductor structure. The selective etch process could be an anisotropic etch process or a combination of isotropic and anisotropic etch processes. During this selective etch process, the third spacer layer 153 will protect that portion of the second conformal dielectric layer, which is between the third spacer layer and both the gate to the side and the substrate below, in order to create a second spacer layer 152 for the second sidewall spacer 150A. As a result of process step 916, the second spacer layer 152 will be positioned laterally immediately adjacent to the first spacer layer 151 and will be essentially L-shaped or backwards L-shaped depending upon whether the second sidewall spacer 150A is on the right-side or left-side of the gate structure 115. The thickness of the second spacer layer 152 will be essentially uniform and equal to the deposited thickness of the second conformal dielectric layer (e.g., 2-6 nm). Furthermore, as a result of the previously performed process step 912, the third spacer layer 153 will be seated on the second spacer layer 152 such that it is physically separated from the semiconductor substrate and will be tapered (e.g., essentially D-shaped or essentially backwards D-shaped, depending upon whether the second sidewall spacer is on the right-side or left-side of the gate structure 115). Furthermore, the third maximum width 173 of the third spacer layer 153 will be essentially equal to the deposited thickness of the third conformal dielectric layer 123 (e.g., at least 15 nm, e.g., 15-30 nm). As a result, the second sidewall spacer 150A will have a second maximum width 172 that is greater than the first maximum width 171 of the first sidewall spacer 116. That is, the first sidewall spacer 116 and the second sidewall spacer 150A will be asymmetric. See detailed discussion above regarding the resulting structure of the second sidewall spacer 150A.

It should be noted that process step 916 can also result in exposure of various semiconductor surfaces including: for each partially completed CTSS-NVM device, the A-Si surface at the top of each gate structure 115 (i.e., due to removal of the dielectric gate cap), the top surface of the semiconductor layer 112 adjacent to the first sidewall spacer 116 and the top surface of the region 107b of the semiconductor substrate 103 adjacent to the second sidewall spacer 150A; and, for each partially completed FET, the A-Si surface at the top of each gate structure 195 and the top surfaces of the semiconductor layers 192. Metal silicide layers (e.g., nickel silicide layers, cobalt silicide layers, titanium silicide layers or any other suitable type of metal silicide layers) can be formed on these exposed semiconductor surfaces using conventional salicidation techniques (see process step 918 and FIG. 10). That is, for each partially completed CTSS-NVM device, metal silicide layers 180a-180c can be formed on the top surface of the region 107b of the semiconductor substrate 103 adjacent to the second sidewall spacer 150A, on the top surface of the semiconductor layer 112 adjacent to the first sidewall spacer 116 and on the A-Si surface at the top of each gate structure 115. For each partially completed FET, additional metal silicide layers 180 can be formed on the A-Si surface at the top of each gate structure 195 and on the top surfaces of the semiconductor layers 192.

Additional processing to complete the semiconductor structure 100A can include, but is not limited to, deposition of one or more additional conformal dielectric layers 181-182 (e.g., a silicon dioxide (SiO2) layer and a silicon nitride (SiN) layer on the SiO2 layer), middle-of-the-line processing (including contact formation), etc. (see process step 920 and FIG. 1A).

Figure 15:
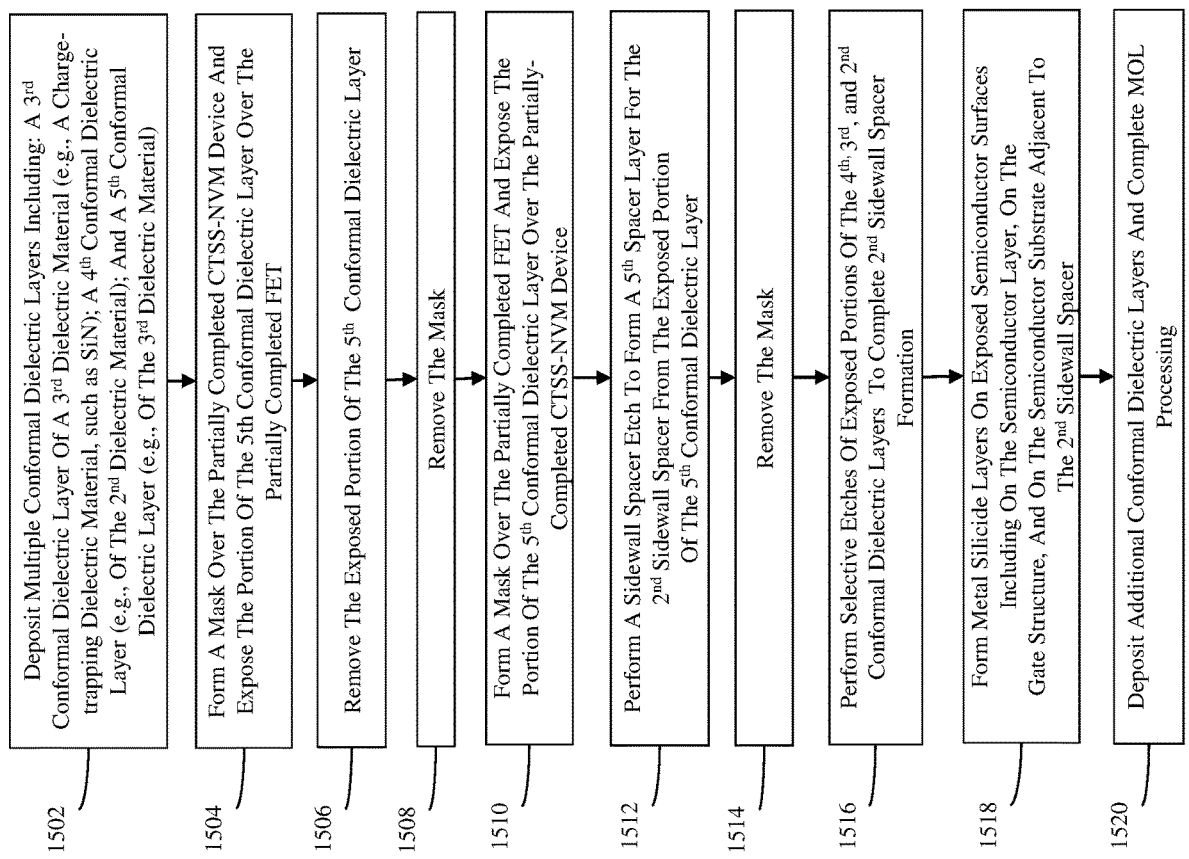
FIG. 15 is a flow diagram illustrating process steps used to form the semiconductor structure embodiment of FIG. 1B.
Figure 16:
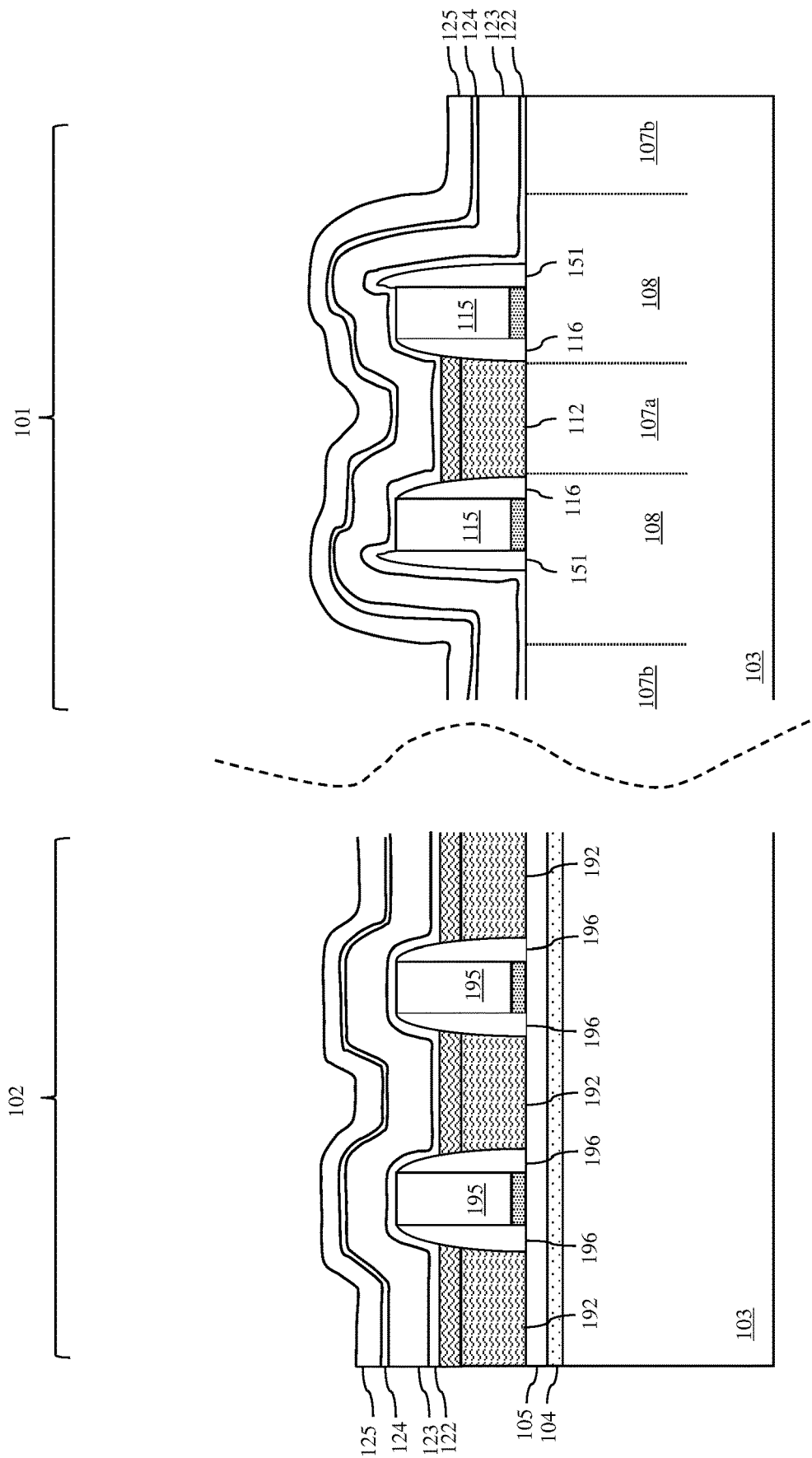
FIGS. 16-20 are cross-section diagrams illustrating partially completed semiconductor structures formed according to the flow diagram of FIG. 15.

Referring to the flow diagram of FIG. 15, in another embodiment of the method multiple conformal dielectric layers can be deposited over the partially completed semiconductor structure (see process step 1502 and FIG. 16). These conformal dielectric layers can include a third conformal dielectric layer 123 of a third dielectric material. The third dielectric material can be different from the first dielectric material and the second dielectric material and, more specifically, can be a charge-trapping dielectric material (e.g., silicon nitride (SiN) or some other suitable charge-trapping dielectric material). The third conformal dielectric layer 123 can be deposited so that it is relatively thin (e.g., 5-15 nm) but thicker than the second conformal dielectric layer 122. It should be noted with integrated processing of CTSS-NVM devices on the bulk semiconductor area of a hybrid substrate and FDSOI FETs in the semiconductor-on-insulator area of the same hybrid substrate, the third conformal dielectric layer 123 in this particular method embodiment can be, for example, the same OP nitride layer employed during conventional FDSOI FET processing. In any case, these conformal dielectric layers can further include a fourth conformal dielectric layer 124, which is made of the same second dielectric material used for the second conformal dielectric layer 122 or some other suitable dielectric material and which is deposited so as to be relatively thin (e.g., 2-6 nm). These conformal dielectric layers can further include a fifth conformal dielectric layer 125, which is made of the same third dielectric material used for the third conformal dielectric layer 123 or some other suitable dielectric material and which is deposited so as to have a thickness of, for example, 5-25 nm.

Figure 17:
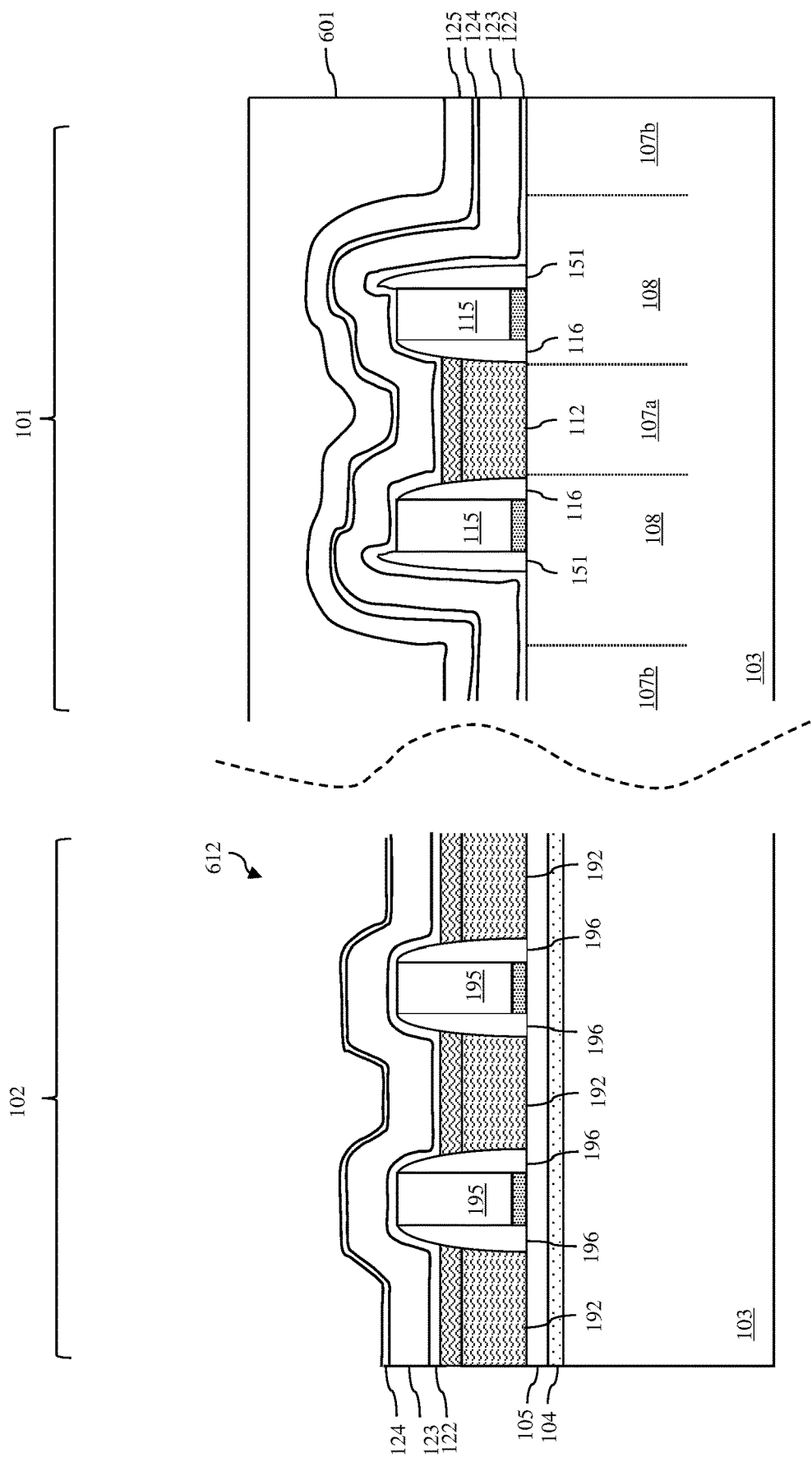

An additional mask layer 601 can be formed on the fifth conformal dielectric layer 125 and patterned (e.g., using conventional lithographic patterning and etch techniques) with an opening 612 (see process step 1504 and FIG. 17). The opening 612 can expose that portion of the fifth conformal dielectric layer 125 in the semiconductor-on-insulator area 102 over the partially completed FET(s). The exposed portion of the fifth conformal dielectric layer 125 can subsequently be selectively removed (e.g., using an isotropic etch process that is selective for the charge-trapping dielectric material, e.g., that is selective for SiN) (see process step 1506 and FIG. 17).

Figure 18:
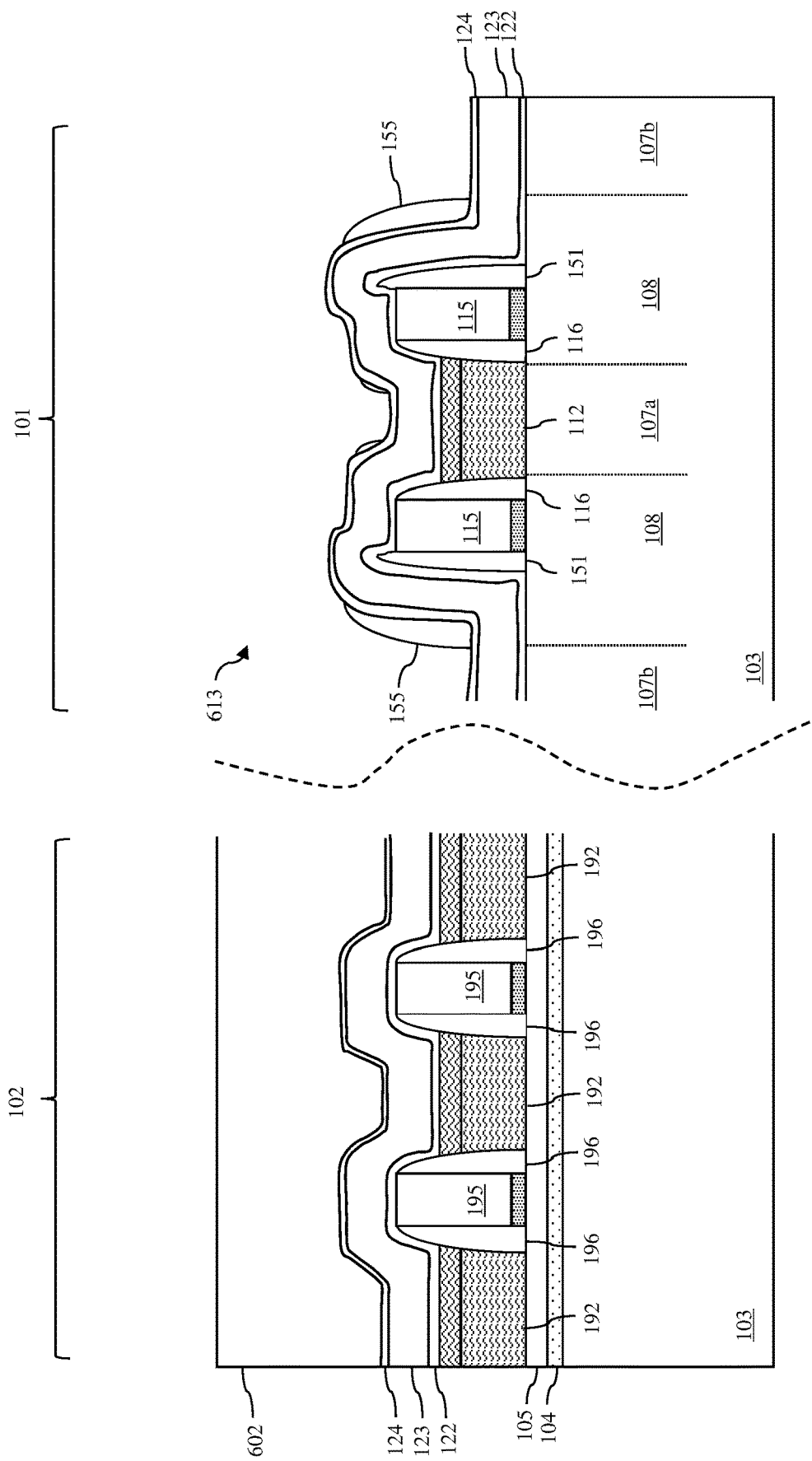

The additional mask layer 601 can then be selectively removed (see process step 1508) and a second additional mask layer 602 can be formed over the partially completed semiconductor structure (see process step 1510 and FIG. 18). The second additional mask layer 602 can be patterned (e.g., using conventional lithographic patterning and etch techniques) with an opening 613. The opening 613 can expose that portion of the fifth conformal dielectric layer 125 in the bulk semiconductor area 101 over the partially completed CTSS-NVM device(s).

Figure 19:
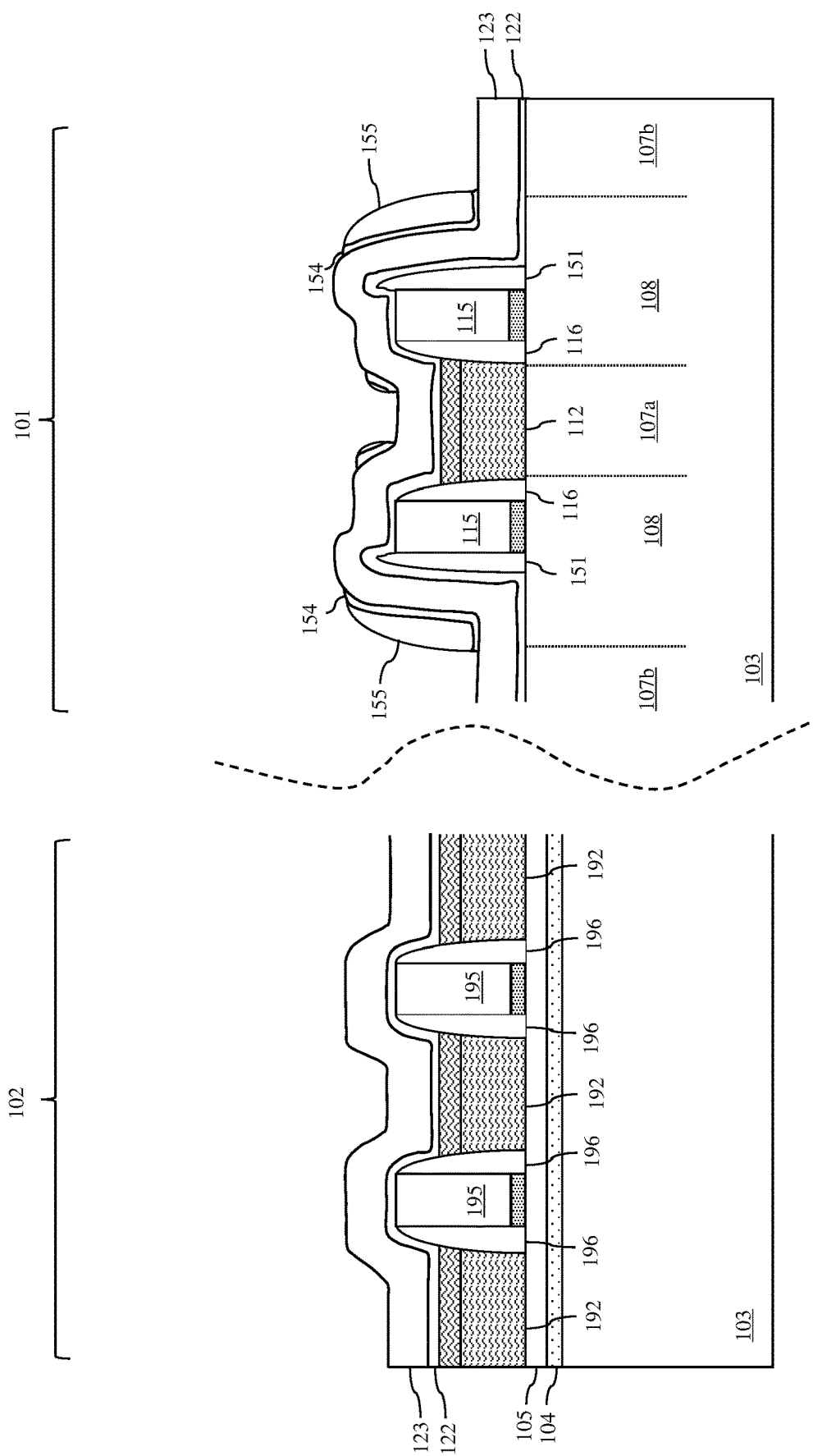

Another conventional sidewall spacer etch process (e.g., a selective anisotropic etch process) can be performed so as to form, from a vertical portion of the exposed portion of the fifth conformal dielectric layer 125 for each partially completed CTSS-NVM device, a fifth spacer layer 155 for the second sidewall spacer 150B (see process step 1512 and FIG. 19).

Figure 20:
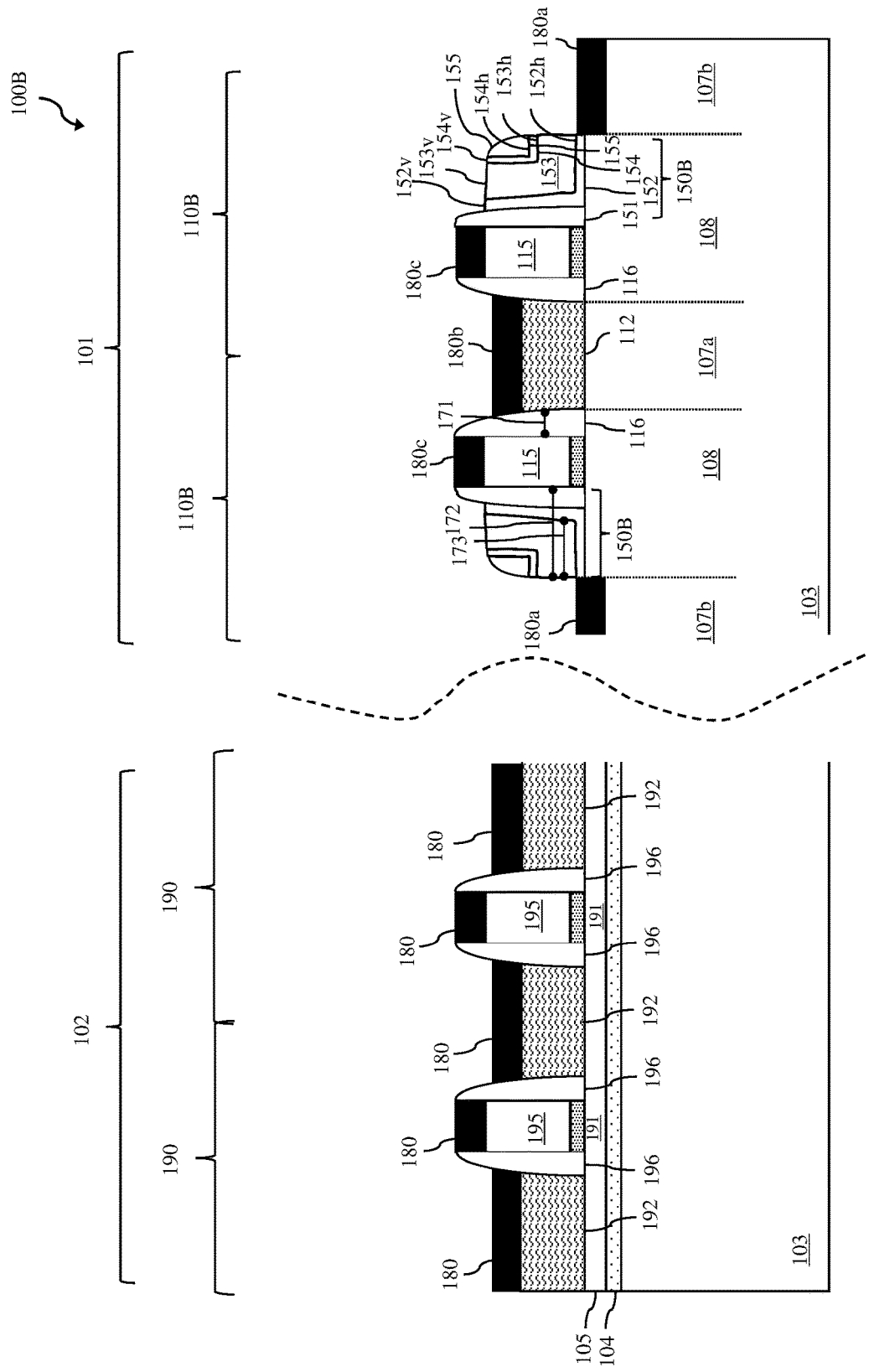

The second additional mask layer 602 can then be selectively removed (see process step 1514) and additional processing can be performed in order to complete the second sidewall spacer 150B (see process step 1516 and FIG. 20). Specifically, exposed portions of the fourth conformal dielectric layer 124 can be selectively etched away. During etching of the fourth conformal dielectric layer 124, the fifth spacer layer 155 will protect that portion of the fourth conformal dielectric layer between the fifth spacer layer 155 and the third conformal dielectric layer 123 to create a fourth spacer layer 154 for the second sidewall spacer 150B. Then, exposed portions of the third conformal dielectric layer 123 can be selectively etched away. During etching of the third conformal dielectric layer 123, the fourth and fifth spacer layers 154-155 will protect that portion of the third conformal dielectric layer between the fourth spacer layer 154 and the second conformal dielectric layer 122 to create a third spacer layer 153 for the second sidewall spacer 150B. Finally, exposed portions of the second conformal dielectric layer 122 can be selectively etched away. During etching of the second conformal dielectric layer 122, the third, fourth and fifth spacer layers 153-155 will protect that portion of the second conformal dielectric layer 122 between third spacer layer 153 and both the first spacer layer 151 to the side and the substrate below to create a second spacer layer 152 for the second sidewall spacer 150B.

It should be noted that process step 1516 can be performed using anisotropic etch processes or a combination of both isotropic and anisotropic etch processes. As a result of process step 1516, the second spacer layer 152 will be on the substrate positioned laterally immediately adjacent to the first spacer layer 151 and will be essentially L-shaped or backwards L-shaped depending upon whether the second sidewall spacer 150B is on the right-side or left-side of the gate structure 115. The thickness of the second spacer layer 152 will be essentially uniform and equal to the deposited thickness of the second conformal dielectric layer (e.g., 2-6 nm). The third spacer layer 153 will be seated on the second spacer layer 152 such that it is physically separated from the semiconductor substrate and will also be essentially L-shaped or backwards L-shaped depending upon whether the second sidewall spacer 150B is on the right-side or left-side of the gate structure 115 (as discussed in greater detail above with regard to the structure). The thickness of the third spacer layer 153 will be essentially uniform and equal to the deposited thickness of the third conformal dielectric layer (e.g., 5-15 nm). The fourth spacer layer 154 will be seated on the third spacer layer 153 and will also be essentially L-shaped or backwards L-shaped depending upon whether the second sidewall spacer 150B is on the right-side or left-side of the gate structure 115 (as discussed in greater detail above with regard to the structure). The thickness of the fourth spacer layer 154 will be essentially uniform and equal to the deposited thickness of the fourth conformal dielectric layer (e.g., 2-6 nm). Finally, as a result of process step 1512, the fifth spacer layer 155 will be seated on the fourth spacer layer 154 and tapered.

It should be noted that process step 1516 can also result in exposure of various semiconductor surfaces including: for each partially completed CTSS-NVM device, the A-Si surface at the top of each gate structure 115 (i.e., due to removal of the dielectric gate cap), the top surface of the semiconductor layer 112 adjacent to the first sidewall spacer 116 and the top surface of the region 107b of the semiconductor substrate 103 adjacent to the second sidewall spacer 150B; and, for each partially completed FET, the A-Si surface at the top of each gate structure 195 and the top surfaces of the semiconductor layers 192. Metal silicide layers (e.g., nickel silicide layers, cobalt silicide layers, titanium silicide layers or any other suitable type of metal silicide layers) can be formed on these exposed semiconductor surfaces using conventional salicidation techniques (see process step 1518 and FIG. 20). That is, for each partially completed CTSS-NVM device, metal silicide layers 180a-180c can be formed on the top surface of the region 107b of the semiconductor substrate 103 adjacent to the second sidewall spacer 150B, on the top surface of the semiconductor layer 112 adjacent to the first sidewall spacer 116 and on the A-Si surface at the top of each gate structure 115. For each partially completed FET, additional metal silicide layers 180 can be formed on the A-Si surface at the top of each gate structure 195 and on the top surfaces of the semiconductor layers 192.

Additional processing to complete the semiconductor structure 100B can include, but is not limited to, deposition of one or more additional conformal dielectric layers 181-182 (e.g., a silicon dioxide (SiO2) layer and a silicon nitride (SiN) layer on the SiO2 layer), middle-of-the-line processing (including contact formation), etc. (see process step 1520 and FIG. 1B).

Figure 21:
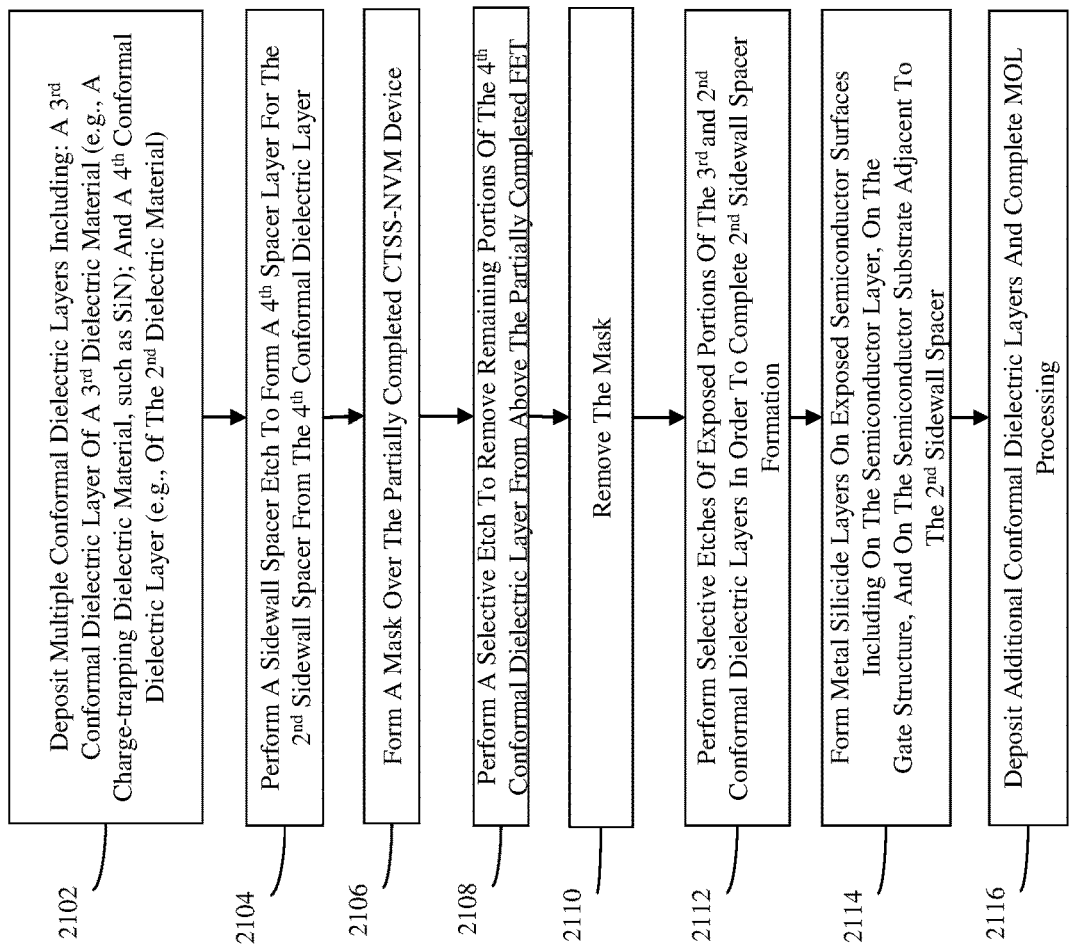
FIG. 21 is a flow diagram illustrating process steps used to form the semiconductor structure embodiment of FIG. 1C.
Figure 22:
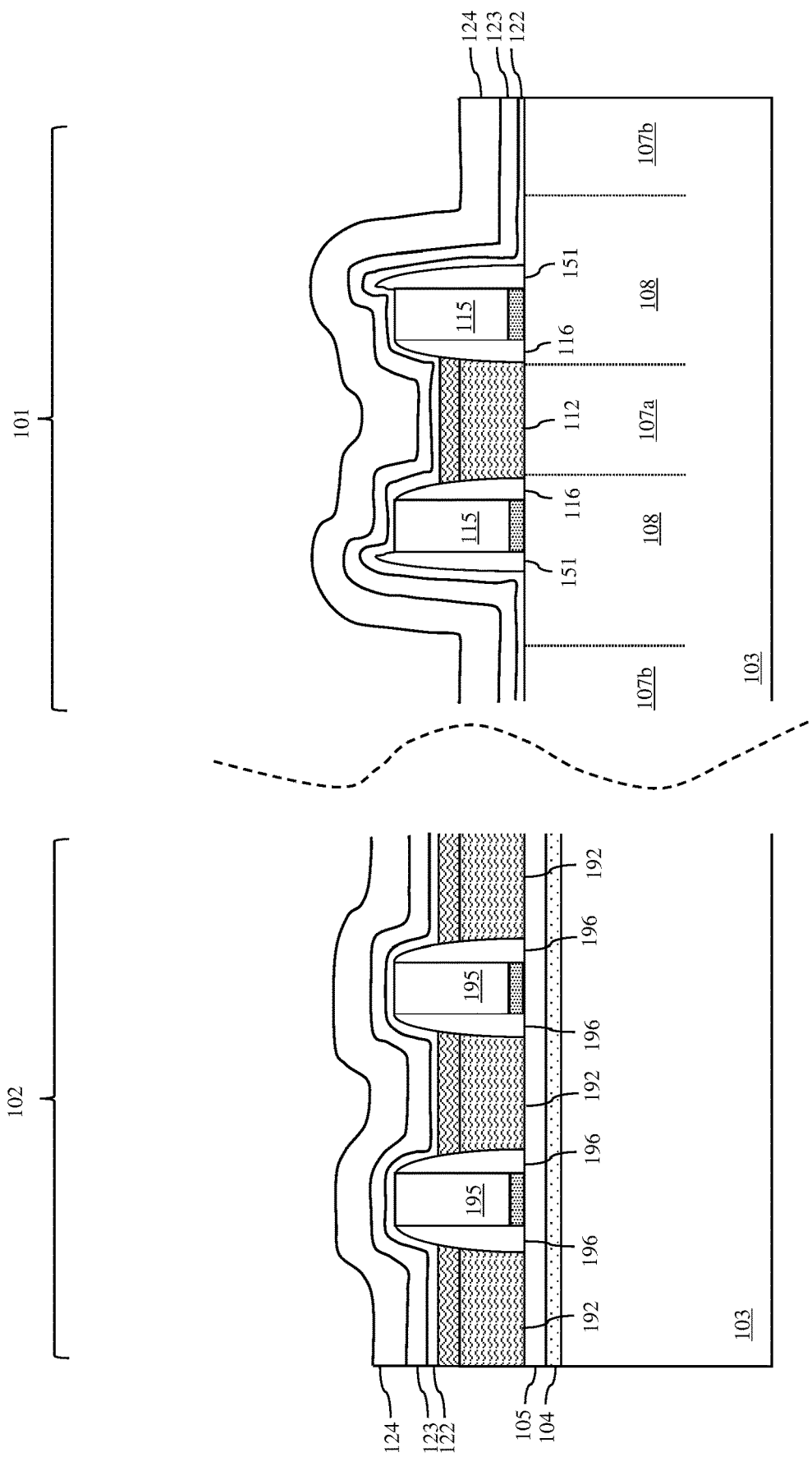
FIGS. 22-25 are cross-section diagrams illustrating partially completed semiconductor structures formed according to the flow diagram of FIG. 21.

Referring to the flow diagram of FIG. 21, in yet another embodiment of the method, multiple conformal dielectric layers can be deposited over the partially completed semiconductor structure (see process step 2102 and FIG. 22). These conformal dielectric layers can include a third conformal dielectric layer 123 of a third dielectric material. The third dielectric material can be different from the first dielectric material and the second dielectric material and, more specifically, can be a charge-trapping dielectric material (e.g., silicon nitride (SiN) or some other suitable charge-trapping dielectric material). The third conformal dielectric layer 123 can be deposited so that it is relatively thin (e.g., 5-15 nm) but thicker than the second conformal dielectric layer 122. It should be noted with integrated processing of CTSS-NVM devices on the bulk semiconductor area of a hybrid substrate and FDSOI FETs in the semiconductor-on-insulator area of the same hybrid substrate, this third conformal dielectric layer 123 in this particular method embodiment can be, for example, the same OP nitride layer employed during conventional FDSOI FET processing. These conformal dielectric layers can further include a fourth conformal dielectric layer 124, which is made of the same second dielectric material used for the second conformal dielectric layer 122 or some other suitable dielectric material and which is deposited so as to be relatively thick (e.g., 10-30 nm).

Figure 23:
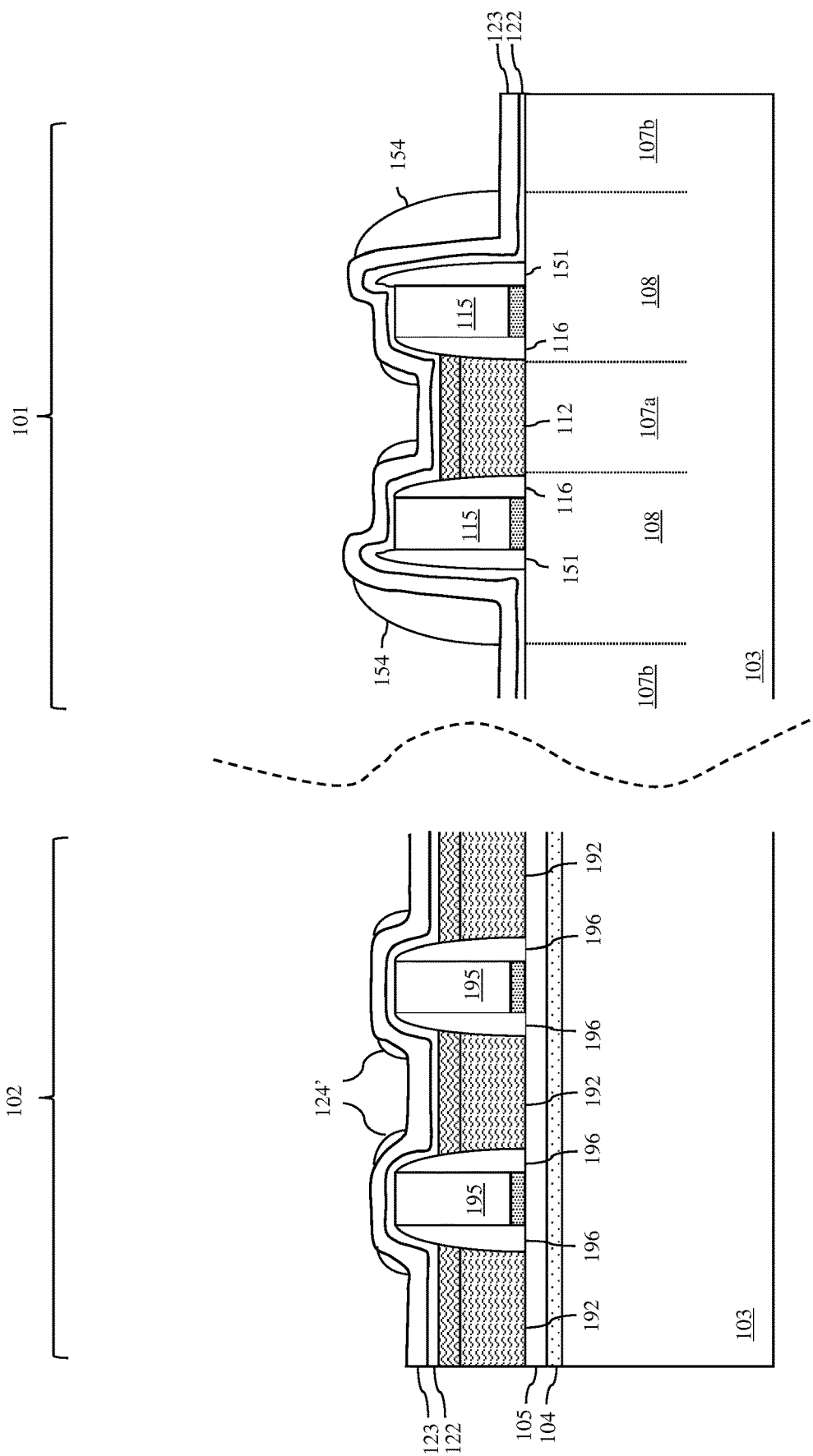
Figure 24:
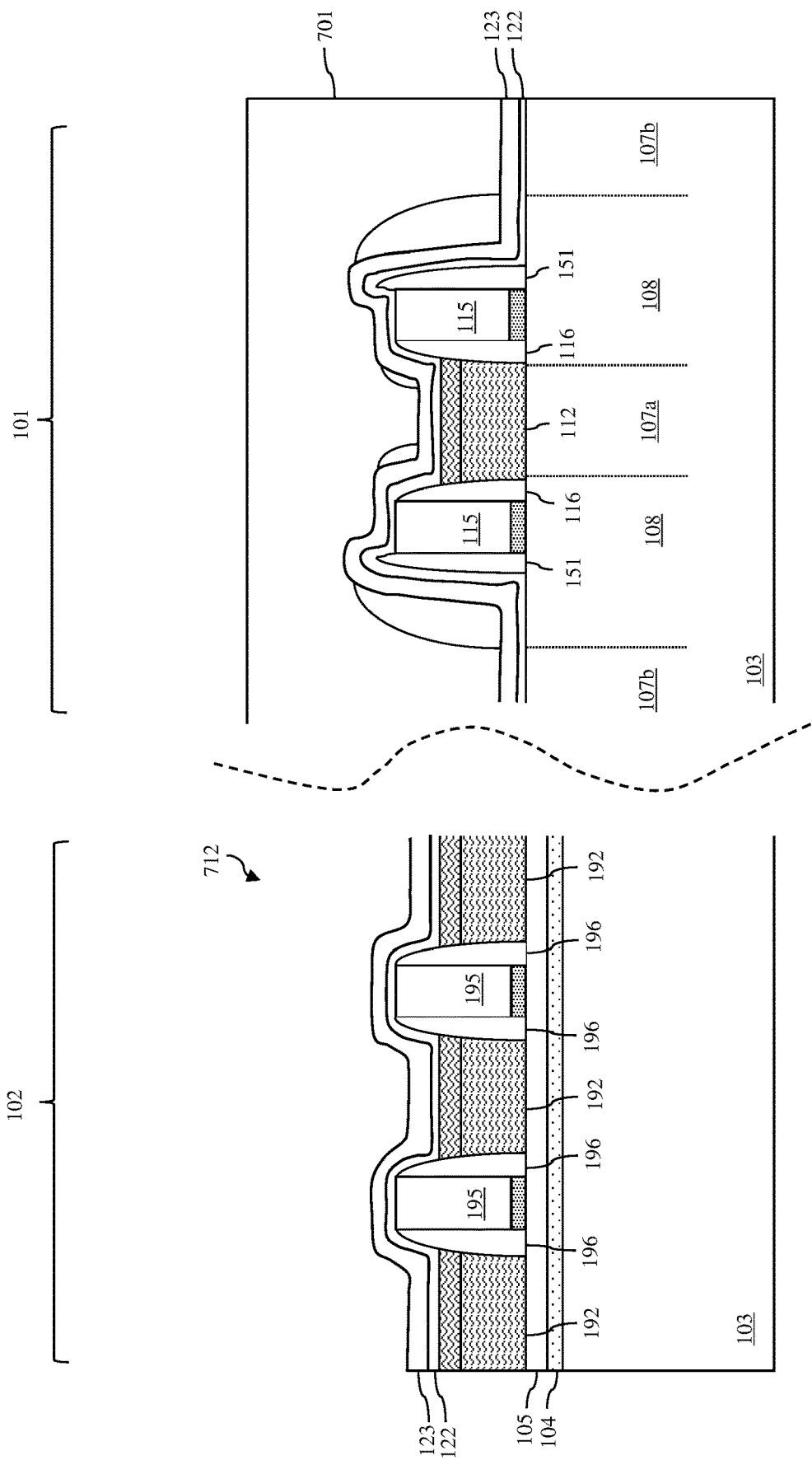

A conventional sidewall spacer etch process (e.g., a selective anisotropic etch process) can be performed so as to form, from a vertical portion of the fourth conformal dielectric layer 124 for each partially completed CTSS-NVM device, a fourth spacer layer 154 for the second sidewall spacer (see process step 2104 and FIG. 23). As illustrated, following process step 2104, unwanted portions 124' of the fourth conformal dielectric layer may still remain on the third conformal dielectric layer 123 within the semiconductor-on-insulator area 102. Thus, an additional mask layer 701 can be formed over the partially completed semiconductor structure and patterned (e.g., using conventional lithographic patterning and etch techniques) with an opening 712 (see process step 2106 and FIG. 24). The opening 712 can expose the semiconductor-on-insulator area 102 so that the unwanted portions of the fourth conformal dielectric layer 124 in the semiconductor-on-insulator area 102 can be selectively removed (e.g., using an isotropic etch process that is selective for $SiO_2$) (see process step 2108 and FIG. 24). Then, the mask layer 712 can be selectively removed (see process step 2110).

Figure 25:
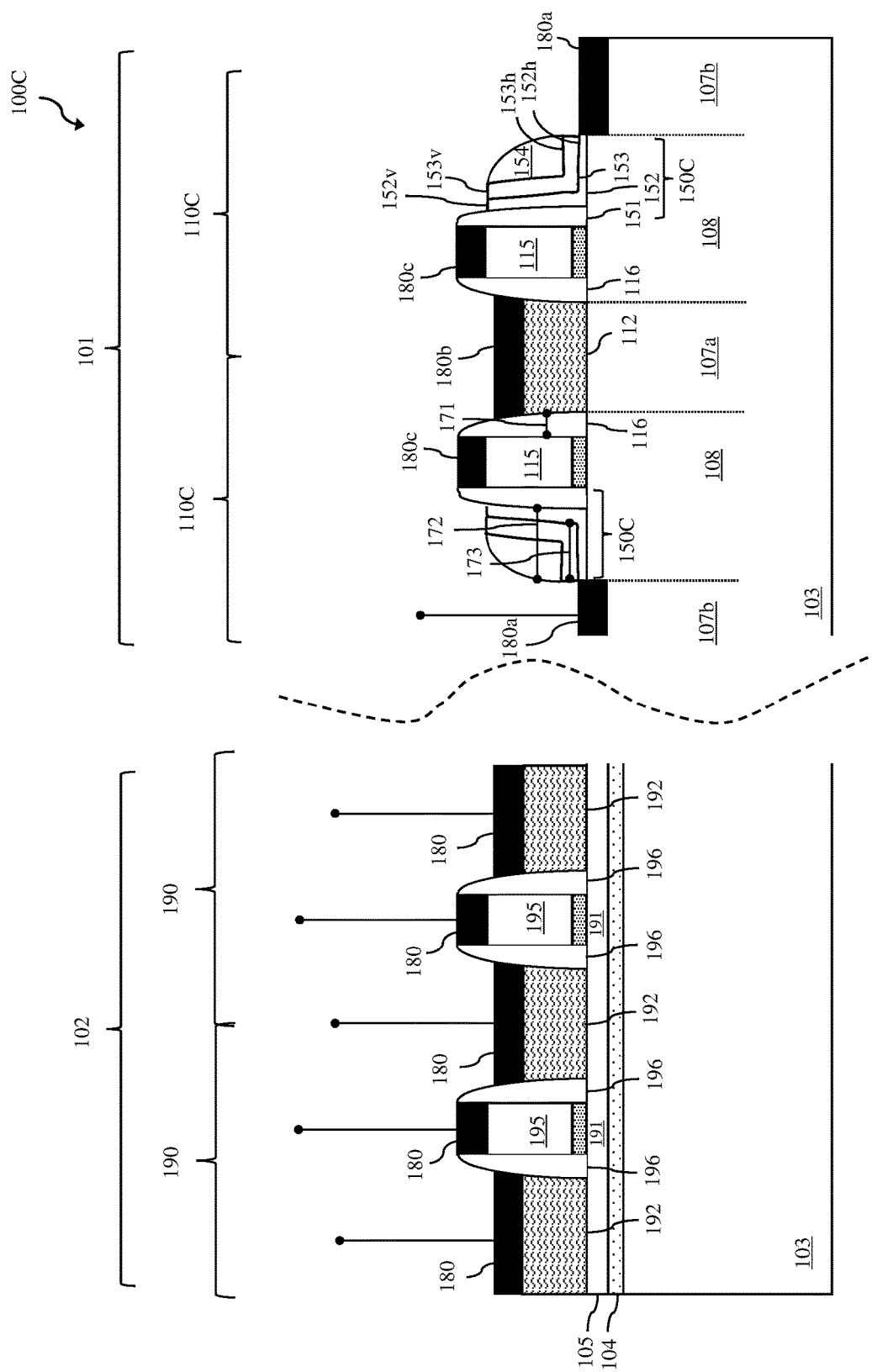

Additional processing can then be performed in order to complete the second sidewall spacer 150C (see process step 2112 and FIG. 25). Specifically, exposed portions of the third conformal dielectric layer 153 can be selectively etched away. During etching of the third conformal dielectric layer 123, the fourth spacer layer 154 will protect that portion of the third conformal dielectric layer between the fourth spacer layer 154 and the second conformal dielectric layer 122 to create a third spacer layer 153 for the second sidewall spacer 150C. Finally, exposed portions of the second conformal dielectric layer 122 can be selectively etched away. During etching of the second conformal dielectric layer 122, the third and fourth spacer layers 153-154 will protect that portion of the second conformal dielectric layer 122 between the third spacer layer 153 and both the first spacer layer 151 to the side and the substrate below to create a second spacer layer 152 for the second sidewall spacer 150C.

It should be noted that process step 2112 can be performed using anisotropic etch processes or a combination of both isotropic and anisotropic etch processes. As a result of process step 2112, the second spacer layer 152 will be positioned laterally immediately adjacent to the first spacer layer 151 and will be essentially L-shaped or backwards L-shaped depending upon whether the second sidewall spacer 150C is on the right-side or left-side of the gate structure 115. The thickness of the second spacer layer 152 will be essentially uniform and equal to the deposited thickness of the second conformal dielectric layer (e.g., 2-6 nm). The third spacer layer 153 will be seated on the second spacer layer 152 such that it is physically separated from the semiconductor substrate and will also be essentially L-shaped or backwards L-shaped depending upon whether the second sidewall spacer 150C is on the right-side or left-side of the gate structure 115 (as discussed in greater detail above with regard to the structure). The thickness of the third spacer layer 153 will be essentially uniform and equal to the deposited thickness of the third conformal dielectric layer (e.g., 5-15 nm). The fourth spacer layer 154 will be seated on the third spacer layer 153 and will be essentially D-shaped or backwards D-shaped depending upon whether the second sidewall spacer 150B is on the right-side or left-side of the gate structure 115 (as discussed in greater detail above with regard to the structure).

It should be noted that process step 2112 can also result in exposure of various semiconductor surfaces including: for each partially completed CTSS-NVM device, the A-Si surface at the top of each gate structure 115 (i.e., due to removal of the dielectric gate cap), the top surface of the semiconductor layer 112 adjacent to the first sidewall spacer 116 and the top surface of the region 107b of the semiconductor substrate 103 adjacent to the second sidewall spacer 150A; and, for each partially completed FET, the A-Si surface at the top of each gate structure 195 and the top surfaces of the semiconductor layers 192. Metal silicide layers (e.g., nickel silicide layers, cobalt silicide layers, titanium silicide layers or any other suitable type of metal silicide layers) can be formed on the exposed semiconductor surfaces using conventional salicidation techniques (see process step 2114 and FIG. 25). That is, for each partially completed CTSS-NVM device, metal silicide layers 180a-180c can be formed on the top surface of the region 107b of the semiconductor substrate 103 adjacent to the second sidewall spacer 150C, on the top surface of the semiconductor layer 112 adjacent to the first sidewall spacer 116 and on the A-Si surface at the top of each gate structure 115. For each partially completed FET, additional metal silicide layers 180 can be formed on the A-Si surface at the top of each gate structure 195 and on the top surfaces of the semiconductor layers 192.

Additional processing to complete the semiconductor structure 100C can include, but is not limited to, deposition of one or more additional conformal dielectric layers 181-182 (e.g., a silicon dioxide (SiO2) layer and a silicon nitride (SiN) layer on the SiO2 layer), middle-of-the-line processing (including contact formation), etc. (see process step 2116 and FIG. 1C).

In each of the above-described method embodiments the different dielectric materials of the deposited conformal dielectric layers, the different thicknesses of the deposited conformal dielectric layers, and the types of selective etch processes used to form the spacer layers can be selected to ensure the following: (a) the first sidewall spacer 116 and the second sidewall spacer 150A, 150B, 150C are asymmetric and, particularly, made of different dielectric materials and have different maximum widths 171 and 172, respectively; (b) the third spacer layer 153 of the second sidewall spacer 150A, 150B, 150C (which is made of the charge-trapping material) is physically separated from the semiconductor substrate (e.g., by a thin silicon dioxide (SiO2) layer); and (c) the third spacer layer 153 has a third maximum width 173 at the bottom end closet to the semiconductor substrate and this third maximum width 173 is sufficient (e.g., at least 15 nm) to achieve the charge-trapping required for proper CTSS-NVM device operation.

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and gallium nitride-based semiconductor materials. A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity or silicon (Si) to achieve N-type conductivity. Those skilled in the art will also recognize that different conductivity levels will depend upon the relative concentration levels of the dopant(s) in a given semiconductor region.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
a semiconductor substrate; and
a non-volatile memory device comprising:
    a channel region in the semiconductor substrate;
    a gate structure on the semiconductor substrate adjacent to the channel region;
    asymmetric sidewall spacers above and immediately adjacent to a top surface of the semiconductor substrate and further positioned laterally adjacent to opposing sidewalls of the gate structure and comprising: a first sidewall spacer with a first width; and a second sidewall spacer with a second width that is greater than the first width, wherein the second sidewall spacer comprises a charge-trapping dielectric material;
    a semiconductor layer above and immediately adjacent to the top surface of the semiconductor substrate and positioned laterally immediately adjacent to the first sidewall spacer such that the first sidewall spacer is positioned laterally between the gate structure and the semiconductor layer; and
    an additional layer immediately adjacent to the top surface of the semiconductor layer, abutting the second sidewall spacer, and comprising a metal.

2. The semiconductor structure of claim 1, wherein the first sidewall spacer comprises a single spacer layer and wherein the second sidewall spacer comprises multiple spacer layers with one of the multiple spacer layers comprising the charge-trapping dielectric material.

3. The semiconductor structure of claim 1,
wherein the first sidewall spacer and the second sidewall spacer each comprise a first spacer layer comprising a first dielectric material, and
wherein the second sidewall spacer further comprises at least:
    a second spacer layer having a first segment positioned laterally immediately adjacent to the first spacer layer and extending away from the semiconductor substrate, wherein the second spacer layer further has a second segment above and immediately adjacent to the semiconductor substrate and extending laterally along the semiconductor substrate essentially perpendicular to the first segment, and wherein the second spacer layer comprises a second dielectric material that is different from the first dielectric material; and
    a third spacer layer comprising a third dielectric material that is different from the first dielectric material and the second dielectric material and that comprises a charge-trapping dielectric material.

4. The semiconductor structure of claim 3,
wherein the third spacer layer has bottom end immediately adjacent to the second segment of the second spacer layer, a top end opposite the bottom end, a first side surface immediately adjacent to the first segment of the second spacer layer, and a second side surface opposite the first side surface, and
wherein the second side surface is curved such that the third spacer layer is tapered from a maximum width at the bottom end to a minimum width at the top end.

5. The semiconductor structure of claim 3,
wherein the third spacer layer has a first segment positioned laterally immediately adjacent to the first segment of the second spacer layer and further has second segment essentially perpendicular to the first segment and positioned above and immediately adjacent to the second segment of the second spacer layer, and wherein the second sidewall spacer further comprises:
a fourth spacer layer having a first segment positioned laterally immediately adjacent to the first segment of the third spacer layer and further having a second segment essentially perpendicular to the first segment and positioned above and immediately adjacent to the second segment of the third spacer layer, wherein the fourth spacer layer comprises the second dielectric material; and
a fifth spacer layer on the fourth spacer layer, tapered and comprising the third dielectric material.

6. The semiconductor structure of claim 3,
wherein the third spacer layer has a first segment positioned laterally immediately adjacent to the first segment of the second spacer layer and further has a second segment essentially perpendicular to the first segment and positioned above and immediately adjacent to the second segment of the second spacer layer, and
wherein the second sidewall spacer further comprises a fourth spacer layer, wherein the fourth spacer layer is tapered and comprises the second dielectric material.

7. The semiconductor structure of claim 3, wherein the semiconductor substrate is a hybrid semiconductor substrate comprising a bulk semiconductor area and a semiconductor-on-insulator area, wherein the non-volatile memory device is in the bulk semiconductor area, and wherein the semiconductor structure further comprises at least one field effect transistor in the semiconductor-on-insulator area.

8. The semiconductor structure of claim 3, further comprising at least one conformal dielectric layer of the second dielectric material covering the non-volatile memory device.

9. The semiconductor structure of claim 1, wherein the semiconductor layer comprises an epitaxial semiconductor layer doped with a source/drain dopant.

10. The semiconductor structure of claim 1, wherein the additional layer comprises a metal silicide layer and wherein the non-volatile memory device further comprises metal silicide layers on the semiconductor layer and on the gate structure.

11. A method comprising:
providing a semiconductor substrate; and
forming a non-volatile memory device, wherein the forming of the non-volatile memory device comprises:
forming a gate structure on the semiconductor substrate such that the gate structure is adjacent to a channel region within the semiconductor substrate; and
forming asymmetric sidewall spacers above and immediately adjacent to a top surface of the semiconductor substrate and further positioned laterally adjacent to opposing sidewalls of the gate structure, wherein the forming of the asymmetric sidewall spacers comprises:
forming a first sidewall spacer with a first width adjacent to a first sidewall of the gate structure; and
forming a second sidewall spacer with a second width that is greater than the first width adjacent to a second sidewall of the gate structure, wherein the second sidewall spacer comprises a charge-trapping dielectric material;
forming a semiconductor layer above and immediately adjacent to the top surface of the semiconductor substrate and further positioned laterally immediately adjacent to the first sidewall spacer such that the first sidewall spacer is positioned laterally between the gate structure and the semiconductor layer; and
forming an additional layer immediately adjacent to the top surface of the semiconductor layer, abutting the second sidewall spacer, and comprising metal.

12. The method of claim 11, wherein the forming of the asymmetric sidewall spacers further comprises:
forming a first conformal layer comprising a first dielectric material over the gate structure;
exposing a first portion of the first conformal layer on a first side of the gate structure and extending over the semiconductor substrate adjacent to the first side, wherein the first sidewall spacer is formed from the first portion of the first conformal layer, wherein the forming of the first sidewall spacer exposes a first region of the semiconductor substrate, and wherein the semiconductor layer is formed on the first region of the semiconductor substrate; and
forming a first spacer layer for the second sidewall spacer from a remaining portion of the first conformal layer.

13. The method of claim 12,
wherein the forming of the asymmetric sidewall spacers further comprises:
forming a second conformal layer, wherein the second conformal layer comprises a second dielectric material that is different from the first dielectric material; and
forming a third conformal layer on the second conformal layer, wherein the third conformal layer comprises a third dielectric material that is different from the first dielectric material and the second dielectric material, and wherein the third dielectric material comprises the charge-trapping dielectric material; and
forming a second spacer layer and a third spacer layer from the second conformal layer and the third conformal layer, respectively, to complete the second sidewall spacer,
wherein the forming of the second spacer layer and the third spacer layer exposes the semiconductor layer, the gate structure, and a second region of the semiconductor substrate,
wherein the additional layer comprising the metal is a metal silicide layer formed on the second region of the semiconductor substrate adjacent to the second sidewall spacer, and
wherein the method further comprises, during the forming of the metal silicide layer on the second region of the semiconductor substrate adjacent to the second sidewall spacer, forming metal silicide layers on the semiconductor layer and the gate structure.

14. The method of claim 11, wherein the providing of the semiconductor substrate comprises providing a hybrid semiconductor substrate having a bulk semiconductor area and a semiconductor-on-insulator area, wherein the forming of the non-volatile memory device further comprises forming the non-volatile memory device in the bulk semiconductor area, and wherein the method further comprises, during the forming of the non-volatile memory device in the bulk semiconductor area, concurrently forming at least one field effect transistor in the semiconductor-on-insulator area.

15. A method comprising:
providing a semiconductor substrate; and
forming a non-volatile memory device on the semiconductor substrate, wherein the forming of the non-volatile memory devices comprises:

forming a gate structure on the semiconductor substrate such that the gate structure is adjacent to a channel region within the semiconductor substrate;

forming asymmetric sidewall spacers on opposing sidewalls of the gate structure, wherein the forming of the asymmetric sidewall spacers comprises:

forming a first sidewall spacer with a first width on a first sidewall of the gate structure; and forming a second sidewall spacer with a second width that is greater than the first width on a second sidewall of the gate structure, wherein the second sidewall spacer comprises multiple spacer layers and wherein one of the multiple spacer layers comprises a charge-trapping dielectric material, has a first segment that is essentially parallel to the gate structure and has a second segment that is essentially parallel to the semiconductor substrate and essentially perpendicular to the first segment;

forming a semiconductor layer on the semiconductor substrate adjacent to the first sidewall spacer; and forming an additional layer comprising metal on the semiconductor substrate adjacent to the second sidewall spacer.

16. The method of claim 15, wherein the forming of the asymmetric sidewall spacers further comprises:

forming a first conformal layer comprising a first dielectric material over the gate structure;

exposing a first portion of the first conformal layer on a first side of the gate structure and extending over the semiconductor substrate adjacent to the first side, wherein the first sidewall spacer is formed from the first portion of the first conformal layer, wherein the forming of the first sidewall spacer exposes a first region of the semiconductor substrate, and wherein the semiconductor layer is formed on the first region of the semiconductor substrate; and forming a first spacer layer of the second sidewall spacer from a remaining portion of the first conformal layer.

17. The method of claim 16, wherein the forming of the asymmetric sidewall spacers further comprises:

forming a second conformal layer, wherein the second conformal layer comprises a second dielectric material that is different from the first dielectric material;

forming a third conformal layer on the second conformal layer, wherein the third conformal layer is thicker than the second conformal layer and comprises a third dielectric material that is different from the first dielectric material and the second dielectric material, wherein the third dielectric material comprises the charge-trapping dielectric material;

forming a fourth conformal layer on the third conformal layer, wherein the fourth conformal layer comprises the second dielectric material;

forming a fifth conformal layer on the fourth conformal layer, wherein the fifth conformal layer comprises the third dielectric material; and forming a second spacer layer, a third spacer layer, a fourth spacer layer and a fifth spacer layer from the second conformal layer, the third conformal layer, the fourth conformal layer, and the fifth conformal layer, respectively, to complete formation of the second sidewall spacer, wherein the forming of the second spacer layer, the third spacer layer, the fourth spacer layer and the fifth spacer layer exposes the semiconductor layer, the gate structure, and a second region of the semiconductor substrate, wherein the additional layer comprising the metal is a metal silicide layer formed on the second region of the semiconductor substrate adjacent to the second sidewall spacer, and wherein the method further comprises, during the forming of the metal silicide layer on the second region of the semiconductor substrate adjacent to the second sidewall spacer, forming metal silicide layers on the semiconductor layer and the gate structure.

18. The method of claim 17, wherein the third conformal layer and the fifth conformal layer are formed thicker than the second conformal layer and the fourth conformal layer.

19. The method of claim 17, wherein the forming of the asymmetric sidewall spacers further comprises:

forming a second conformal layer, wherein the second conformal layer comprises a second dielectric material that is different from the first dielectric material;

forming a third conformal layer on the second conformal layer, wherein the third dielectric material comprises the charge-trapping dielectric material;

forming a fourth conformal layer on the third conformal layer, wherein the fourth conformal layer comprises the second dielectric material; and forming a second spacer layer, a third spacer layer, and a fourth spacer layer from the second conformal layer, the third conformal layer, and the fourth conformal layer, respectively, to complete formation of the second sidewall spacer, wherein the forming of the second spacer layer, the third spacer layer, and the fourth spacer layer exposes the semiconductor layer, the gate structure, and a second region of the semiconductor substrate, wherein the additional layer comprising the metal is a metal silicide layer formed on the second region of the semiconductor substrate adjacent to the second sidewall spacer, and wherein the method further comprises, during the forming of the metal silicide layer on the second region of the semiconductor substrate adjacent to the second sidewall spacer, forming metal silicide layers on the semiconductor layer and the gate structure.

20. The method of claim 19, wherein the fourth conformal layer and the third conformal layer are formed thicker than the second conformal layer.

* * * * *